US010290332B1

(12) United States Patent
Sim et al.

(10) Patent No.: US 10,290,332 B1
(45) Date of Patent: May 14, 2019

(54) SIGNAL PATH OPTIMIZATION FOR READ OPERATIONS IN STORAGE DEVICES

(71) Applicant: SanDisk Technologies LLC, Plano, TX (US)

(72) Inventors: Yukeun Sim, San Jose, CA (US); Anurag Nigam, San Jose, CA (US); Yingchang Chen, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/799,688

(22) Filed: Oct. 31, 2017

(51) Int. Cl.
*G11C 5/06* (2006.01)
*G11C 7/08* (2006.01)
*G11C 7/10* (2006.01)
*G11C 7/22* (2006.01)

(52) U.S. Cl.
CPC ............. *G11C 7/08* (2013.01); *G11C 5/06* (2013.01); *G11C 7/1006* (2013.01); *G11C 7/1063* (2013.01); *G11C 7/222* (2013.01)

(58) Field of Classification Search
CPC .................................................... G11C 5/06
USPC ............................................ 365/51, 52, 63
See application file for complete search history.

(56) References Cited

U.S. PATENT DOCUMENTS

| | | | | |
|---|---|---|---|---|
| 5,706,474 A * | 1/1998 | Takeuchi | ............ | G06F 13/1689 711/1 |
| 5,970,010 A * | 10/1999 | Hira | ..................... | G11C 11/4091 365/189.08 |
| 6,535,038 B2 * | 3/2003 | Hofstra | ..................... | G06F 1/10 327/149 |
| 7,177,998 B2 * | 2/2007 | Ware | ..................... | G06F 13/1684 711/167 |
| 7,486,575 B2 * | 2/2009 | Park | ..................... | G11C 7/1045 365/193 |
| 7,502,272 B2 * | 3/2009 | Ahmad | ..................... | G11C 7/08 365/189.14 |

OTHER PUBLICATIONS

Micron Technologies, Inc., TN-46-14, "Hardware Tips for Point-to-Point System Design Introduction", 2006, 16 pages.
Micron Technologies, Inc., TN-41-13, "DDR3 Point-to-Point Design Support Introduction", 2013, 27 pages.

* cited by examiner

*Primary Examiner* — Son L Mai
(74) *Attorney, Agent, or Firm* — Brinks, Gilson & Lione

(57) ABSTRACT

A system may include a controller, a data receiving circuit, and a plurality of banks. The banks may send data to the data receiving circuit via a common data bus. The controller may control the communication of the data to the receiving circuit by sending control signals and clock signals to the banks. Relative lengths of control signal paths and clock signal paths may be directly related to each other and inversely related to relative lengths of data paths.

20 Claims, 8 Drawing Sheets

US 10,290,332 B1

SIGNAL PATH OPTIMIZATION FOR READ OPERATIONS IN STORAGE DEVICES

BACKGROUND

In a multi-chip storage device, a controller located on a first chip may be configured to communicate with a host device, and memory cells storing data may be located on a second chip. When the host wants to read data stored in the memory cells, it may send a host read command to the controller of the first chip, and in turn the controller may retrieve the data from memory cells located on the second chip. Control logic on the second chip may send the data to the controller of the first chip via an external data bus.

For some example configurations, in order for the control logic of the second chip to transfer the data to the controller, the data may be sensed out of the memory cells into page registers and then communicated to a conversion circuit, such as a serializer/deserializer (SerDes), via an internal data bus. The conversion circuit may convert the data it receives from the page registers via the internal data bus into a format that is suitable for transmission over the external data bus.

Size and layout requirements of the second chip may yield latencies and sampling window limitations. Such latencies and limitations may be tolerable under present operating read speeds, but prohibit increases. Thus, ways to reduce or eliminate the latencies and/or increase the data windows may be desirable so that increases in operating read speeds may be achieved.

BRIEF DESCRIPTION OF THE DRAWINGS

The accompanying drawings, which are incorporated in and constitute a part of this specification illustrate various aspects of the description. Wherever convenient, the same reference numbers will be used throughout the drawings to refer to the same or like elements.

DETAILED DESCRIPTION

Overview

Figure 1A:
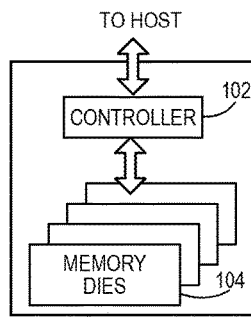
FIG. 1A is a block diagram of an example memory system.

By way of introduction, the below embodiments relate to apparatuses, devices, systems, circuits and related methods for minimizing latency and maximizing sampling windows for read operations. In one embodiment, a circuit a first bank and a second bank. The first bank is coupled to a control interface by way of a first control path. The second bank is coupled to the control interface by way of a second control path. The second control path has a length that is longer than a length of the first control path. Also, the second bank has a physical position closer to the control interface than a physical position of the first bank.

In some embodiments, the first bank is configured to retrieve first data in response to receipt of a first control signal by way of the first control path, and output the first data to a data receiving circuit. Also, the second bank is configured to retrieve second data in response to receipt of a second control signal by way of the second control path, and output the second data to the data receiving circuit.

In some embodiments, the first bank is configured to output the first data on a first data path to the data receiving circuit, and the second bank is configured to output the second data on a second data path to the data receiving circuit. Also, the first data path has a length longer than a length of the second data path.

In some embodiments, the first data path and the second data path share a common data bus.

In some embodiments, the data receiving circuit comprises a serializer/deserializer circuit.

In some embodiments, a controller is configured to output the first control signal in advance of an end of a bias time period associated with the first bank.

In some embodiments, the controller is configured to output the first control signal one clock cycle ahead of the end of the bias time period.

In some embodiments, The circuit of claim 1, the first bank is coupled to the control interface further by way of a first clock path, and the second bank is coupled to the control interface further by way of a second clock path, where the second clock path has a length that is longer than a length of the first clock path.

In some embodiments, the first clock path and the second clock path share a common clock path portion.

In some embodiments, the first control path comprises a first sense amp enable path and the second control path comprises a second sense amp enable path.

In another embodiment, a circuit includes a controller, a first bank, and a second bank. The controller is configured to output a clock signal on a first clock path and on a second clock path, where the second clock path has a length longer than a length of the first clock path. The first bank is configured to receive the clock signal via the first clock path, and in response to receipt of the clock signal, output the first data to a data receiving circuit via a first data path. The second bank is configured to receive the clock signal via the second clock path, and in response to receipt of the clock signal, output the second data to the data receiving circuit via the second data path, where the second data path has a length shorter than a length of the first data path.

In some embodiments, the controller is further configured to output a first sense amp enable signal on a first sense amp enable path to the first bank; and output a second sense amp enable signal on a second sense amp enable path to the second bank. The second sense amp enable path has a length longer than a length of the first sense amp enable path.

In some embodiments, the controller is further configured to output the first sense amp enable signal in advance of an end of a bias time associated with the first bank.

In some embodiments, the first bank and the second bank are part of a bank set comprising a plurality of banks, and wherein the first bank has a farthest distance from the receiving circuit among the plurality of banks.

In some embodiments, the first data path and the second data path share a common data bus.

In some embodiments, the data receiving circuit comprises a serializer/deserializer circuit.

In some embodiments, the serializer/deserializer circuit comprises a burst mode serializer/deserializer circuit.

In another embodiment, a system includes: a common data bus; a data receiving circuit; and on-chip controller, and a plurality of memory banks. The on-chip controller is configured to output a clock signal, receive a read command from an off-chip controller, and in response to the read command, output a first sense enable signal on a first sense enable path and a second sense enable signal on a second sense enable path, where the second sense enable path comprises a length longer than a length of the first sense enable path. The plurality of memory banks is coupled to the common data bus, and include a first memory bank and a second memory bank. The first memory bank is configured to receive the clock signal, receive the first sense enable signal via the first sense enable path, and in response to receipt of the clock signal and the first sense enable signal, output the first data to the data sampling circuit via a first data path comprising the common data bus. The second memory bank is configured to: receive the clock signal, receive the second sense enable signal via the second sense enable path, and in response to receipt of the clock signal and the second sense enable signal, output the second data to the data sampling circuit via a second data path comprising the common data bus, where the second data path comprises a length shorter than a length of the first data path.

In some embodiments, the plurality of memory banks are coupled to the on-chip controller by way of sense amp enable paths and clock paths, and wherein relative lengths of the sense amp enable paths and relative lengths of the clock paths are directly related.

In some embodiments, the plurality of memory banks are coupled to the on-chip controller by way of clock paths, the plurality of memory banks are coupled to the data receiving circuit by way of data paths, and relative lengths of the clock paths and relative lengths of the data paths are inversely related.

Other embodiments are possible, and each of the embodiments can be used alone or together in combination. Accordingly, various embodiments will now be described with reference to the attached drawings.

Embodiments

The following embodiments describe apparatuses, devices, systems, circuits, and methods for minimizing latency and maximizing sampling windows for read operations. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure that they are operating properly, map out bad memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s) 104, even if a single channel is shown in the drawings.

Figure 1B:
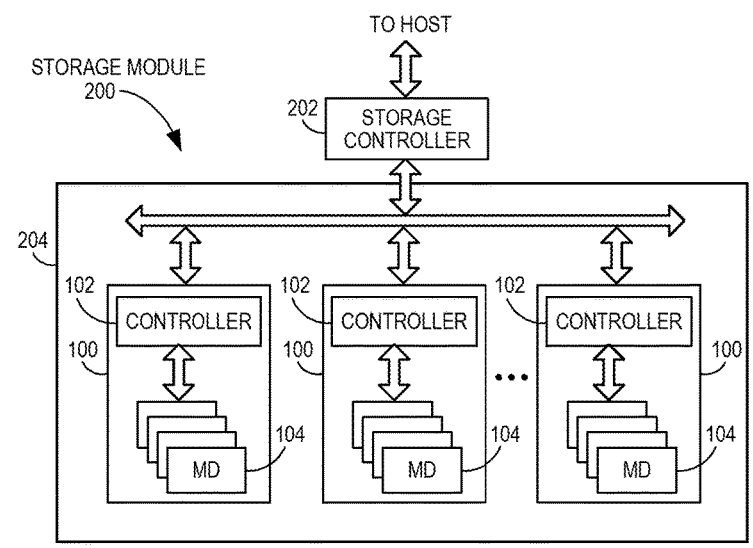
FIG. 1B is a block diagram of a storage module that includes a plurality of memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
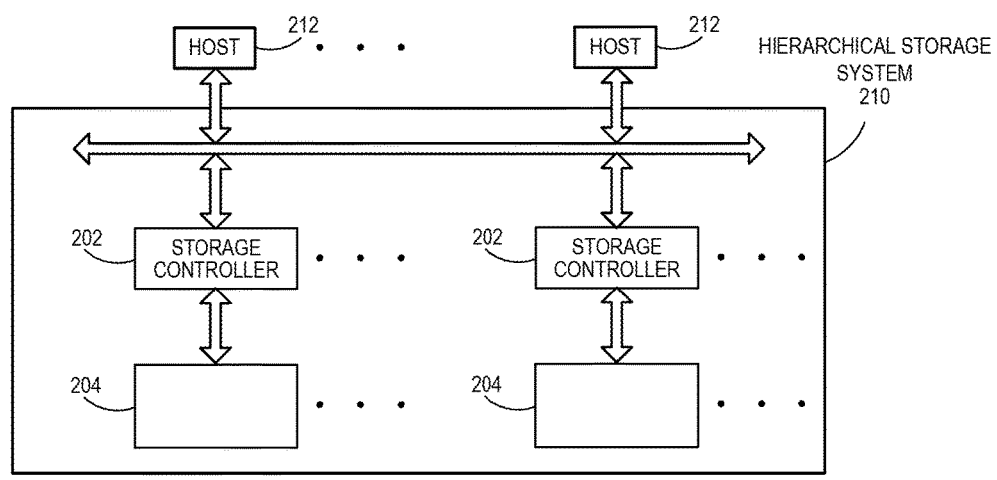
FIG. 1C is a block diagram of a hierarchical storage system.

FIG. 1C is a block diagram illustrating a hierarchical storage system 210. The hierarchical storage system 210 may include a plurality of storage controllers 202, each of which controls a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
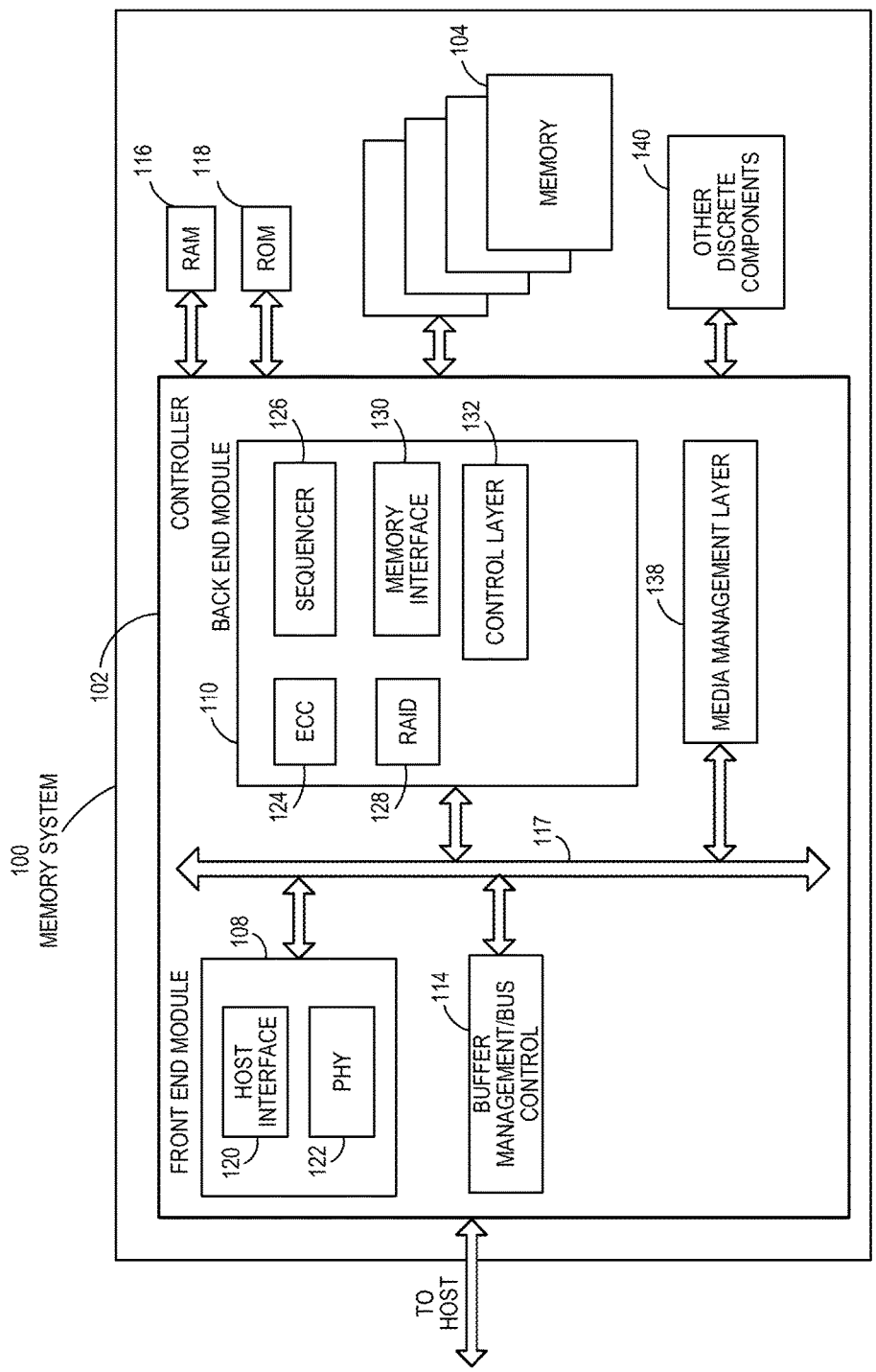
FIG. 2A is a block diagram of exemplary components of a controller of the memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138, which performs wear leveling of memory cells of the non-volatile memory die 104, address management, and facilitates folding operations as described in further detail below. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
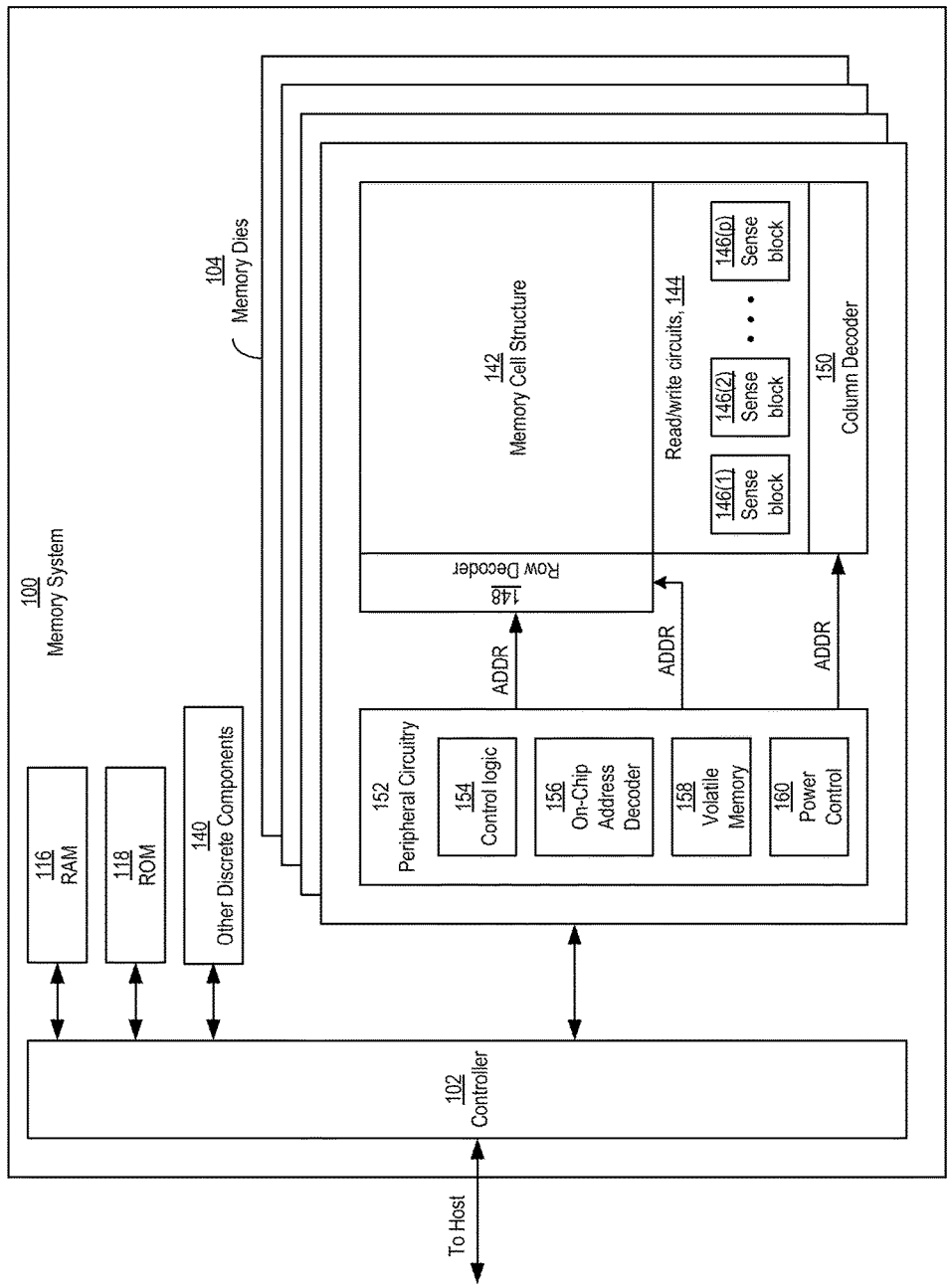
FIG. 2B is a block diagram of exemplary components of a memory die of the memory system of FIG. 1A.

FIG. 2B is a block diagram illustrating exemplary components of a memory die 104 in more detail. The memory die 104 may include a memory cell structure 142 that includes a plurality of memory cells or memory elements. Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor or other material capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

Additional way of organizing the memory cells of the memory cell structure 142 may be possible. As a non-limiting example, the memory cells may be organized into blocks, and the blocks may be organized into planes. Additionally, the memory cells of the memory cell structure may be connected to biasing lines, including word lines and bit lines. Circuitry on the memory die may be configured to bias the word lines and bit lines with various voltages in order to perform memory operations associated with the memory cells, including read, program, and erase operations.

The memory die 104 may further include read/write circuits 144 that includes a plurality or p-number of sense blocks (also referred to as sense modules or sense circuits) 146. As described in further detail below, the sense blocks 146 are configured to participate in reading or programming the memory cells.

The memory die 104 may also include a row address decoder 148 and a column address decoder 150. The row address decoder 148 may decode a row address and select a particular word line when reading or writing data to/from the memory cells. The column address decoder 150 may decode a column address to select a particular group of bit lines in the memory cell structure 142 to read/write circuits 144.

In addition, the non-volatile memory die 104 may include peripheral circuitry 152. The peripheral circuitry 152 may include control logic circuitry 154, which may be implemented as a state machine, that provides on-chip control of memory operations as well as status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158. An example configuration of the volatile memory 158 may include latches, although other configurations are possible.

In addition, the peripheral circuitry 152 may include power control circuitry 160 that is configured to generate and supply voltages to the memory array 142, including read voltages, program voltages (including program voltage pulses) to the wordlines, erase voltages (including erase voltage pulses), as well as other voltages that may be supplied to the word lines and bit lines of the memory cell structure 142, the read/write circuits 144, including the sense blocks 146, and/or other circuit components on the memory die 104. In addition, the power control circuitry 160 may communicate with and/or be controlled by the control logic circuitry 154, the read/write circuits 144, and/or the sense blocks 146 in order to supply the voltages at appropriate levels and appropriate times to carry out the memory operations. For clarity, and unless otherwise specified, the combination of the power control circuitry 160, the read/write circuitry 144, and the sense blocks 146 used to bias word lines and bit lines at appropriate levels during a given memory operation (e.g., a programming operation, a verify operation, a program-verify operation, a read operation, or an erase operation) is herein referred to collectively as voltage supply circuitry. Voltage supply circuitry may refer to the power control circuitry 160, the sense block circuitry 146, other circuit components of the read/write circuitry 144, or any combination thereof. The voltage supply circuitry may include any of various circuit topologies or configurations to supply the voltages at appropriate levels to perform the read, write, and erase operations, such as driver circuits, charge pumps, reference voltage generators, and pulse generation circuits, or a combination thereof. Other types of circuits to generate the voltages may be possible.

During a read operation to read data stored in target memory cells, the sense blocks 146 may be configured to perform sense operations to sense current flow through the bit lines connected to the target memory cells. The voltage supply circuitry may supply voltages on word lines and bit lines at appropriate levels that cause the target memory cells to draw or not to draw current through bit lines to which they are connected. For a given sense operation involving a memory cell connected to a bit line, the level or amount of current that a sense block 146 senses during a sense operation may identify the data value (e.g., a binary or logic value) of the data that the memory cell is storing.

Figure 3:
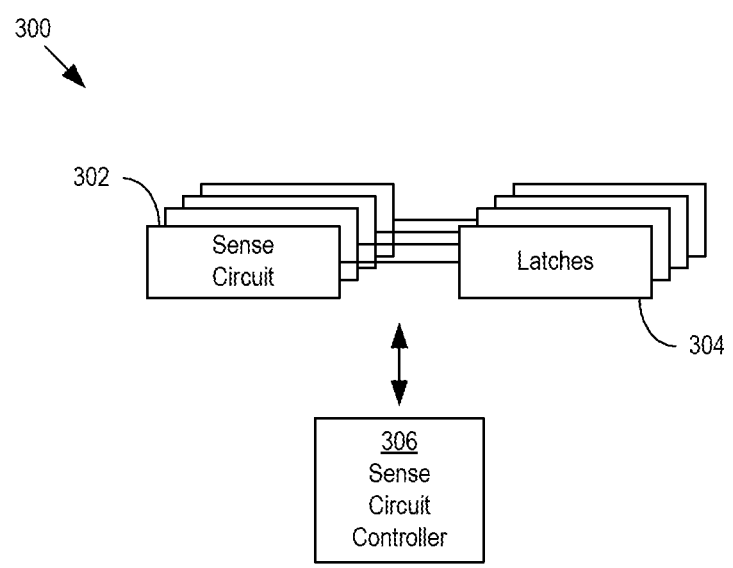
FIG. 3 is a block diagram of an example configuration of a sense block of FIG. 2B.

FIG. 3 is a block diagram of an example configuration of a sense block 300, which may be representative of one of the sense blocks 146(1) to 146(p) of FIG. 2B. The sense block 300 may include a plurality of sense circuits 302 and a plurality of latches 304. Each sense circuit (also referred to as a sense amplifier circuit) 302 may be associated with a respective one of the latches 304. That is, each sense circuit 302 may be configured to communicate with and/or perform a sense operation using data and/or storing data into its associated latches 304.

Additionally, the sense block 300 may include a sense circuit controller 306 that is configured to control operation of the sense circuits 302 and the latches 304 of the sense block 300. As described in further detail below, the sense circuit controller 306 may control operation of the sense circuits 302 and the latches 304 by outputting control signals to terminals of the sense circuits 302 and the latches 304. Additionally, the sense circuit controller 306 may communicate with and/or may be a part of the control logic 154. The sense circuit controller 306 may be implemented in hardware, or a combination of hardware and software. For example, the sense circuit controller 306 may include a processor that executes computer instructions stored in memory to perform at least some of its functions.

The following embodiments with respect to FIGS. 4-7 describe configurations of components of a memory die 104 for optimizing read operations by eliminating or minimizing latencies and maximizing sampling windows. In particular, the embodiments describe path configurations for different types of paths that communicate different types of signals in the read operations. As used herein, in various embodiments, a path is a transmission line that is configured to communicate a signal from one circuit component to another circuit component. A given path may have an associated length and an associated propagation delay. In addition, a path may include a single, continuous conductive element or a plurality conductive elements. For embodiments implemented on an integrated circuit, such as a memory die 104, the path may comprise any component or combination of components suitable to transmit a signal on, or in, an integrated circuit, non-limiting examples of which include traces, vias, wire bonds, bond pads, or solder bumps. However, a path is not necessarily limited to only components used for integrated circuits, and may additionally, or alternatively, include other types of transmission lines that can carry or communicate signals and that have an associated length and propagation delay, including coaxial cables, striplines, waveguides, or optical fibers as non-limiting examples.

Figure 4:
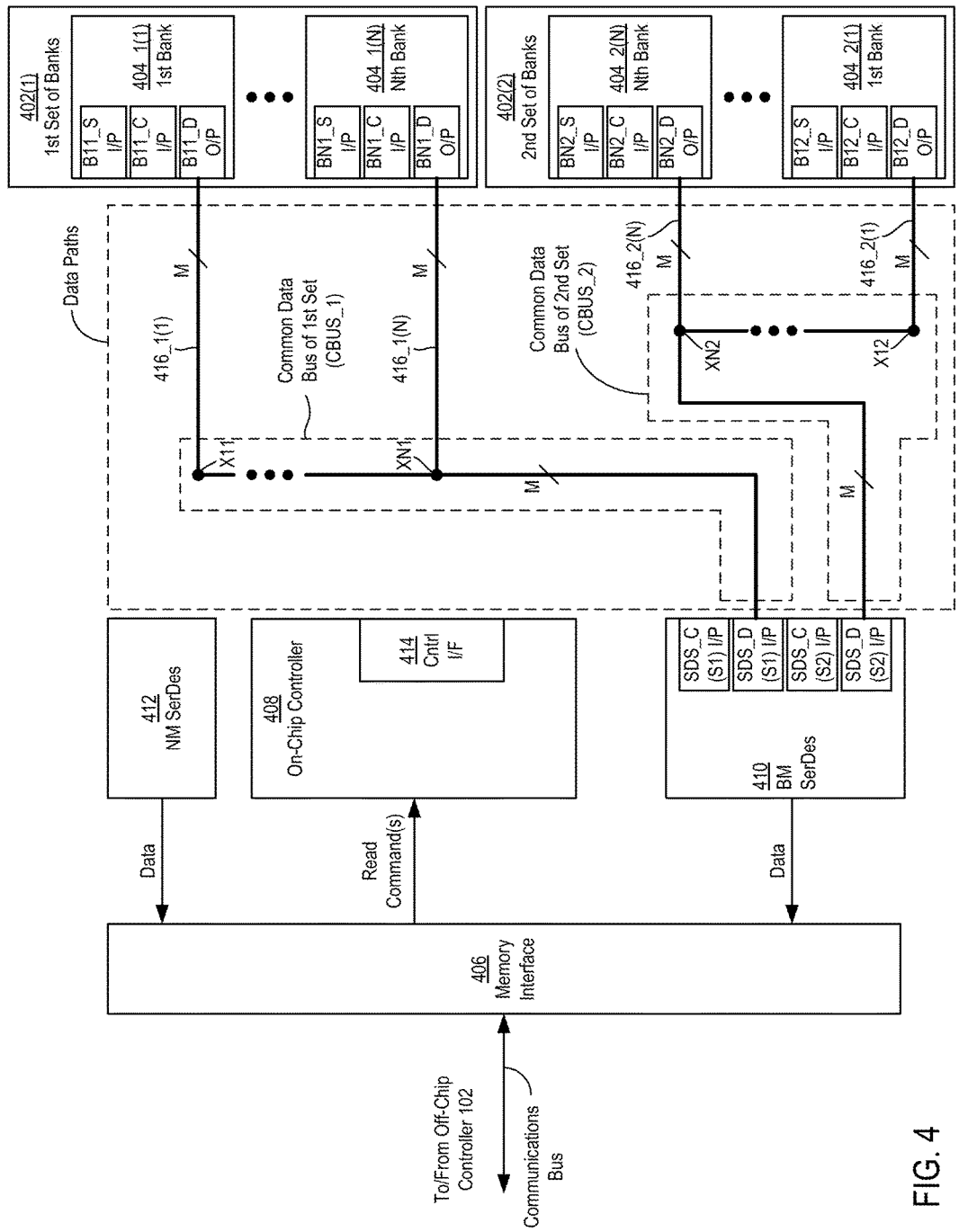
FIG. 4 is a block diagram of components of the memory die of FIG. 2B involved in a read operation, showing an example data path configuration.
Figure 5:
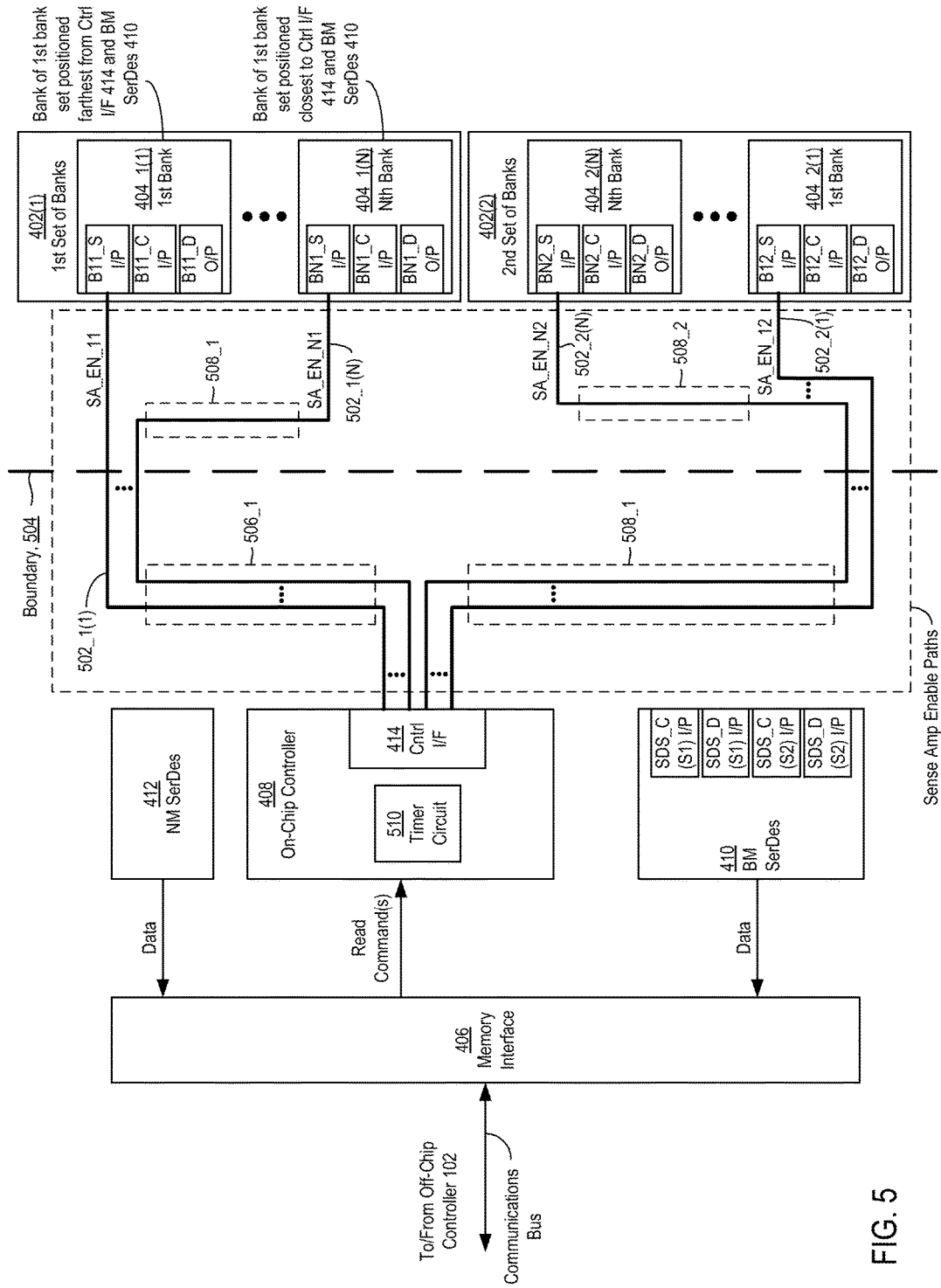
FIG. 5 is a block diagram of the components of FIG. 4, showing an example sense amp enable path configuration.
Figure 7:
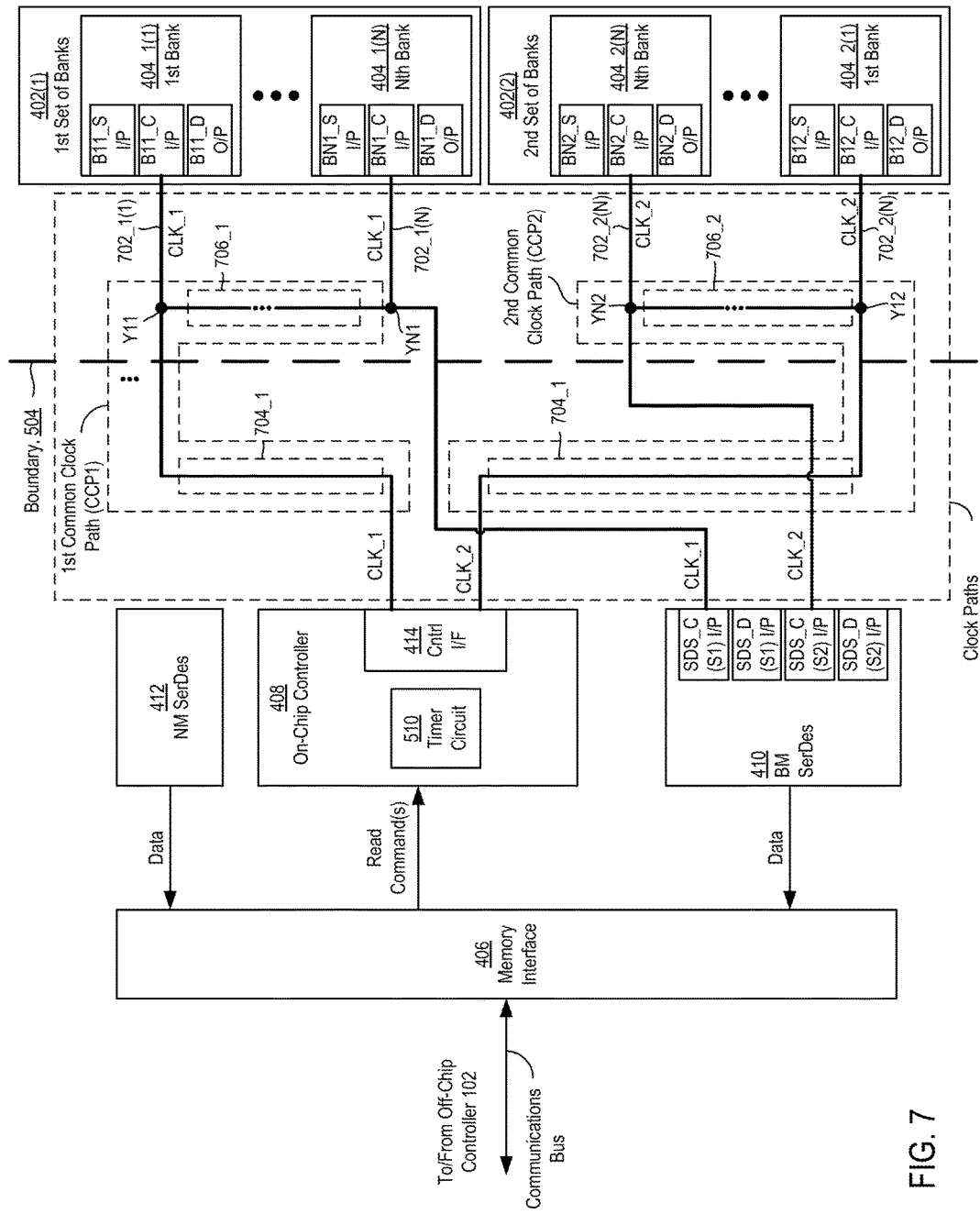
FIG. 7 is a block diagram of the components of FIG. 4, showing an example clock path configuration.

Additionally, for the example embodiments described herein, the different types of paths and signals include data paths that communicate data signals, control paths that communicate control signals, and clock paths that communicate clock signals. The configurations establish relative lengths of paths of the same type as well as relative lengths of paths of different types to provide the optimization. Further, the control paths and control signals for which the optimization configurations are described below include sense amplifier (amp) enable paths and sense amp enable signals, which are communicated on the memory die 104 to trigger sense operations. Similar optimization configurations may be applicable for other control paths configured to communicate types of control signals other than sense amp enable signals. Additionally, the optimization configurations are described with reference to bank sets that provide data to a burst mode serializer/deserializer (SerDes) as part of read operations to read data from the memory die 104, although the optimization configurations may be similarly applicable for other systems that utilize clock signals and sense amp enable signals (or other control signals) to communicate data. As used herein, a bank set is a collection of banks. A bank is a set of common memory or storage components organized, and configured, in such a way that a single storage or memory operation can be completed using the components of the bank. Execution of one storage or memory operation using one bank is independent of another storage or memory operation completed using another bank. In addition or alternatively, certain components of a memory die 104 may be arranged or organized into banks such that different banks include different portions of these components. For example, with reference to FIG. 2B, one bank may include a portion of the memory cell structure 142, a portion of the read/write circuits 144, a portion of the sense blocks 146, a portion of the row decoder 148, and a portion of the column decoder 150. FIG. 4 shows an example configuration of the data paths, FIG. 5 shows an example configuration of the sense amp enable paths, and FIG. 7 shows an example configuration of the clock paths.

FIG. 4 is a block diagram of example components of a memory die 104 of the memory system 100 that may be involved in read operations. The example components include one or more sets of banks 402, otherwise referred to as a bank set. FIG. 4 shows two bank sets 402(1), 402(2), although numbers other than two, including three or more bank sets or a single bank set, may be possible. Each ith bank set 402(i) may include a plurality or an N-number of banks 404_i. For example, the first bank set 402(1) includes an N-number of banks 404_1(1) to 404_1(N), and the second bank set 402(1) includes an N-number of banks 404_2(1) to 404_2(N). The number N may be the same or different for different bank sets 402. In one example configuration, the number of banks 404 in each bank set 402 is eight (i.e., N=8), although other numbers are possible. Each bank may be configured store, such as temporarily store, data sensed from the memory cell structure 142 as part of a read operation.

Additional components of a memory die 104 that may be involved in read operations include a memory interface 406, an on-chip controller 408, and data conversion circuitry, including a burst mode (BM) serializer/deserializer (SerDes) 410 and a normal mode (NM) SerDes 412. These components may be considered part of the peripheral circuitry 152, such as part of the control logic 154, the on-chip address decoder 156, the volatile memory 158, and/or the power control circuitry 160, although in some cases, they may be configured separately from the peripheral circuitry 152. For example, all or some of the components may be part of the read/write circuits 144.

The memory interface 406 may provide the interface for the memory die 104 and components of the memory system 100 external to the memory die 104. Accordingly, data, commands, clock signals, or other information or signals communicated to and/or from the components of the memory die 104 may be communicated through the memory interface 406.

The on-chip controller 408 may be configured to control the communication of data from the memory banks 404 to the BM SerDes 410 or the NM SerDes 412. In this context, the BM SerDes 410 and the NM SerDes 412 may be data receiving circuits in that they receive data from the banks 404. Additionally, the on-chip controller 408 is referred to as "on-chip" in that it is located or configured on the memory die 104. In this context, the controller 102 (FIG. 2A, 2B) is referred to as an off-chip controller in that is located "off-chip" from the memory die 104. When the off-chip controller 102 wants to read certain data (e.g. one or more data sets) from the memory cell structure 142 of the memory die 104, it may send a read command to the on-chip controller 408 via the memory interface 406 to have the memory die 104 perform a read operation. In response, the on-chip controller 408 may perform certain actions or control certain actions that are part of the read operation to be performed to have the requested data sent to the off-chip controller 102 and/or loaded into the RAM 116 (FIGS. 2A, 2B). Also as described in further detail below, the on-chip controller 408 may include a control interface (I/F) 414 through which the on-chip controller 408 may be configured to send control signals, such as sense amplifier (amp) enable signals SA_EN, and clock signals to other components on the memory die 104 for performance of the read operation.

As used herein, in various embodiments, a control interface comprises a hardware module, component, and/or device configured to send one or more control signals to two or more components or modules of the system using a predefined communication protocol. In one embodiments, the control interface sends control signals in parallel to a plurality of components or modules. In another embodiment, the control interface sends control signals in series to a plurality of components or modules over point-to-point communication paths or a network of linked communication paths. Those of skill in the art will recognize that the control interface may be implemented using discrete logic components, synthesized logic components, a state machine, a general processing unit that exercises a set of firmware instructions, or the like. Additionally, as described in further detail below, the control interface 414 is the component of the on-chip controller 408 connected to control paths (e.g., sense amp enable paths) and clock paths. When the on-chip controller 408 wants to send control signals and clock signals to other components of the memory die 104, the control interface 414 outputs the control signals and clock signals onto respective control paths and clock paths for communication to the other components.

The BM SerDes 410 and the NM SerDes 412 may each be configured to perform respective serialization and deserialization operations to convert data between a respective on-chip interface and a respective off-chip interface. That is, the communications bus over which the off-chip controller 102 and the memory die 104 communicate may include a certain number of parallel data lines on which data signals may be communicated in parallel. Each of the BM SerDes 410 and the NM SerDes 412 may include an input interface that includes data inputs (I/P) that receive data to be sent off chip from data paths on the memory die 104. Each of the BM SerDes 410 and the NM SerDes 412 may be configured to convert the data it receives into a format that the memory interface 406 can transmit onto the communications bus.

The memory die 104 may include two SerDes circuits—i.e., the BM SerDes 410 and the NM SerDes 412—in order to operate in two different modes to handle read commands associated with the different mode from the off-chip controller 102. The different modes may include a normal mode and a burst mode. The normal mode and the burst mode may specify or correspond to different communication formats. Although not limited, different communication formats may correspond to or be specified by different numbers of bits to be communicated in parallel or different bit rates, with the burst mode typically specifying a larger number of bits or a larger bit rate. The off-chip controller 102 may be configured to send read commands to the memory die 104 that specifies or indicates whether it wants the memory die 104 to handle the read command in the normal mode or in the burst mode. In this context, a single burst mode read command may be a command for a larger amount of data than a single normal mode read command. The memory die 104 may be configured to handle both types of read commands, and in doing so, the banks 404 may be configured to output data differently for the different types of modes. For example, the banks 404 may each be configured to output larger amounts of data in parallel onto a larger number of data lines when operating in the burst mode than when operating in the normal mode. The NM SerDes 412 may be configured to process data output from the banks 404 in the normal mode, and the BM SerDes may be configured to process data output from the banks 404 in the burst mode, such that regardless of the mode, the memory interface 406 is able to transmit the requested data to the off-chip controller 102. In addition, for at least some example configurations, the normal mode and the burst mode may correspond to different read protocols. For example, the normal mode may correspond to a protocol associated with the memory technology of the memory cell structure 142, such as a NAND protocol for example, whereas the burst mode may correspond to a burst mode protocol.

With respect to the banks 404, each jth bank 404_$i(j)$ of an ith bank set 402($i$) may include an associated interface that includes a sense amplifier (amp) enable input Bji_S I/P, a clock input Bji_C I/P, and a data output Bji_D O/P. As described in further detail below, the sense amp enable input Bji_S I/P is coupled to an associated sense amp enable path and configured to receive an associated sense amp enable signal SA_EN_ji from the on-chip controller 408 via the associated sense amp enable path. Additionally, the clock input Bji_C I/P is coupled to an associated clock path and configured to receive a clock signal from the on-chip controller 408 via the associated clock path.

As shown in FIG. 4, the memory die 104 may also include a plurality of data paths configured to communicate data (e.g., in the form of data signals or data pulses) from the banks 404 to the BM SerDes 410. The banks 404 may be coupled to the BM SerDes 410 bey way of the data paths. In particular, the data paths may couple the data outputs Bji_D O/P of the banks 404 to data inputs SDS_D(S1) I/P, SDS_D (S2) I/P for communication of the data from the banks 404 to the BM SerDes 410.

Each data path may be associated with one of the banks 404 and coupled to a data output Bji_D O/P of a jth bank 404_$i(j)$ with which the data path is associated. In addition, each data path may include an M-number of data lines configured to communicate an M-number of data signals or data pulses in parallel. In some example configurations, the M-number of data lines of a data path may physically extend substantially parallel and/or adjacent to each other. An example number for M is 64, which may be associated with the burst mode and/or the burst mode protocol, although other numbers may be possible.

In addition, each data path may include two portions, including a specific portion 416 that is specific to an associated bank 404, and a common or shared portion that is common or shared with other data paths associated with banks 404 of the same ith bank set 402(*i*). Accordingly, each jth bank 404_*i*(*j*) may be configured to output, via its data output Bij_D O/P, an M-number data signals or data pulses onto an associated specific data path portion 416_*i*(*j*) for communication to the BM SerDes 410.

Additionally, the common or shared portion may be referred to as a common data bus (CBUS). Each ith bank set 402(*i*) may be associated with an ith common data bus CBUS_i. Otherwise stated, banks 404_*i* of the same ith bank set 402(*i*) may be coupled to the same ith common data bus CBUS_i. Data paths associated with banks 404_*i* of the same bank set 402(*i*) may share the same ith common data bus CBUS_i. By sharing the same ith common data bus CBUS_i, the data paths over that shared portion are the same. For the example configuration shown in FIG. 4, the first set of banks 402(1) may be associated with a first common data bus CBUS_1 and the second set of banks 402(2) may be associated with a second common data bus CBUS_2. Data output from each of the N-number of banks 404_1(1) to 404_1(N) of the first bank set 402(1) may be communicated via the first common data bus CBUS_1 to reach the BM SerDes 410. Similarly, data output from each of the N-number of banks 404_2(1) to 404_2(N) of the second bank set 402(2) may be communicated via the second common data bus CBUS_2 to reach the BM SerDes 410.

For some example configurations as shown in FIG. 4, the BM SerDes 410 may include a first data input SDS_D(S1) I/P associated with and coupled to the first common data bus CBUS_1 and a second data input SDS_D(S2) I/P associated with and coupled to the second common data bus CBUS_2. Accordingly, each data path of an associated jth bank 404_*i*(*j*) of an ith bank set 402(*i*) may include an M-number of lines that extend from an associated data output Bji_D O/P of the jth bank 404_*i*(*j*) to an ith SerDes data input SDS_D(Si) I/P, and include an associated specific portion 416_*i*(*j*) associated with the jth bank and a common portion CBUS_i associated with the ith bank set 402(*i*) in which the associated jth bank 402(*j*) is configured.

In addition, each specific data path portion 416_*i*(*j*) may be connected to an associated common data bus CBUS_i at an associated connection point (or plurality of connection points) Xji. So, as examples, the specific data path portion 416_1(1) specific to the first bank 404_1(1) of the first bank set 402(1) may be connected to the first common data bus CBUS_1 at a connection point (or set of connection points) X11, and the specific data path portion 416_1(N) specific to the Nth bank 404_1(N) of the first bank set 402(1) may be connected to the first common data bus CBUS_1 at a connection point (or set of connection points) XN1.

Also, each data path of an associated jth bank 404_*i*(*j*) of an ith bank set 402(*i*) may have an associated total length, which may include a sum of a first length and a second length. The first length is a length of the associated specific data path portion 416_*i*(*j*) extending from the associated data output Bji_D O/P of the jth bank 404_*i*(*j*) to its associated connection point Xji. The second length is a length of the associated common data bus CBUS_i extending from the associated connection point Xji to the associated SerDes data input SDS_D(Si) I/P.

Each data path may have an associated total length relative to the other data paths, at least for those data paths associated with banks that are part of the same bank set. For at least some example configurations, for the banks of the same bank set, the associated data paths may have different lengths from each other, which in turn may determine or yield an order of data path lengths extending from a longest data path length to a shortest data path length. In particular example configurations such as shown in FIG. 4 and as described in further detail below, for a given ith bank set 402(*i*), the data paths may have continuously decreasing lengths from the first bank 404_*i*(1) to the Nth bank 404_*i*(N).

Additionally, the banks 404_*i* of a given ith bank set 402(*i*) may have relative distances and/or physical positions from the BM SerDes 410 and/or the data inputs SDS_D I/P of the BM SerDes 410. For at least one of the banks sets 402, such as the first bank set 402(1), the distances or physical positions of the banks 404_*i* in a given ith bank set 402(*i*) may directly correspond and/or be directly related to their associated data path lengths. For example, with respect to the first bank set 402(1), the farther a bank 404_1 of the first bank set 402(1) is away (i.e., the greater its distance) from the BM SerDes 410, the longer its associated data path length relative to the other data path lengths associated with other banks of the first bank set 402(1). Similarly, the closer a bank 404_1 of the first bank set 402(1) is (i.e., the shorter its distance) to the BM SerDes 410, the shorter its associated data path length relative to the other data path lengths associated with other banks of the first bank set 402(1). Accordingly, the first bank 404_1(1) has a distance to the BM SerDes 410 that is the longest or largest distance among the distances of the banks 404_1 of the first bank set 402(1) to the BM SerDes 410, and the first bank 404_1(1) is configured to communicate data to the BM SerDes 410 over an associated data path that is the longest data path among the data paths associated with banks of the first bank set 402(1). Additionally, the Nth bank 404_1(N) has a distance that is the shortest or smallest distance among the distances of the banks 404_1 of the first bank set 402(1) to the BM SerDes 410, and the Nth bank 404_1(N) is configured to communicate data to the BM SerDes 410 over an associated data path that is the shortest data path among the data paths associated with banks of the first bank set 402(1).

Additionally, for some example configurations, all of the bank sets 402 may not have data path lengths that are directly related to the distances of associated banks to the BM SerDes 410. For example, with respect to the second bank set 402(2), the data paths associated with banks 404_2 of the second bank set 402(2) may have different lengths from each other, which in turn may establish an order of data paths lengths from longest to shortest. However that order may not directly correspond to the distances of the associated banks 404_2 to the BM SerDes 410. In the example configuration shown in FIG. 4, the first bank 404_2(1) of the second bank set 402(2) may have the longest associated data path, the Nth bank 404_2(N) of the second bank set 402(2) may have the shortest associated data path, and the bank(s) 404_2 in between the first bank 404_2(1) and the Nth bank 404_2(N) may have increasingly shorter associated data paths. However, the data path lengths of the banks 404_2 of the second bank set 402(2) may not necessarily directly correspond to the distances of the banks 404_2 to the BM SerDes 410. Irrespective of the relationship between the data path lengths and the distances of associated banks to the BM SerDes 410, the data paths may have relative lengths that are inversely related to relative lengths of sense amp enable paths and relative lengths of clock paths, as described in further detail below with respect to FIGS. 5 and 7.

FIG. 5 is a block diagram of the example components involved in performance of a read operation as shown in FIG. 4, but shows an example configuration of sense amp enable paths 502 instead of data paths. In actual implementation, the data paths shown in FIG. 4 and the sense enable paths 502 are both present on the memory die 104. For clarity, FIGS. 4 and 5 respectively show the data paths and the sense amp enable paths 502 in isolation from each other.

As part of a read operation, when the on-chip controller 408 wants to read data from a particular part of the memory cell structure 142, such as a page or a block for example, the on-chip controller 408 may control the voltage supply circuitry to supply biasing voltages at certain selected and unselected levels to word lines and bit lines in order bias the memory cells and retrieve the data stored in the memory cells. The process that involves the on-chip controller 408 issuing necessary control signals to the voltage supply circuitry for biasing certain word lines and bit lines at certain levels and the voltage supply circuitry biasing those lines may be referred to as a biasing process of a read operation. The on-chip controller 408 and the voltage supply circuitry may take a certain amount of bias time, referred to herein as a bias time period Tbias, to perform the biasing process. Once the bias time period Tbias has ended, one or more sense circuits 302 (FIG. 3) may be configured to perform a sense operation to sense the data into an associated bank 404.

The on-chip controller 408 may be configured to output sense amp enable signals SA_EN, each to an associated one of the plurality of banks 404 to retrieve data, such as by to controlling the sense circuits 302 to perform sense operations. Where a sense circuit 302 is configured to perform a given sense operation to have data (or a data set) stored or loaded into a jth bank 404_i(j) of an ith bank set 402(i), the on-chip controller 408 may be configured to send an associated sense amp enable signal SA_EN_ji to the associated jth bank 404_i(j) to trigger the sense circuit 302 to start the sense operation. After sense operations are performed, the banks 404 may then output the data to the BM SerDes 410 by way of the data paths, as described in further detail below.

The on-chip controller 408 may be configured to output the sense amp enable signals SA_EN to the banks 404 via its control interface 414. In addition, each jth bank 404_i(j) of an ith data set 402(i) may be configured to receive an associated sense amp enable signal SA_EN_ji from the on-chip controller 408 at its sense amp enable input Bji_S I/P. When the jth bank 404_i(j) receives its associated sense amp enable signal SA_EN_ji, the bank 404_i(j) may communicate the sense amp enable signal SA_EN_ji to an associated sense circuit 302 to perform an associated sense operation.

The banks 404 may be coupled to the on-chip controller 408 and/or its control interface 414 by way of the sense amp enable paths. In particular, the control interface 414 may be coupled to the sense amp enable paths, and when the on-chip controller 408 wants to send the sense amp enable signals SA_EN to the banks, the control interface 414 outputs the sense amp enable signals SA_EN onto the sense amp enable paths. In turn, the sense amp enable paths 502 may be configured to communicate the sense amp enable signals SA_EN from the on-chip controller 408 to the banks 404. Each of the sense amp enable paths 502 may be associated with one of the banks 404. Accordingly, each jth bank 404_i(j) of an ith bank set 402(i) may be associated with a jth sense amp enable path 502_j(i), and its sense amp enable input Bji_S I/P may be coupled to the associated jth sense amp enable path 502_j(i) and configured to receive an associated sense amp enable signal SA_EN_ji from the associated jth sense amp enable path 502_j(i). Otherwise stated, when the on-chip controller 408 wants certain sense circuits 302 to perform sense operations to load certain data into a jth bank 404_j(i) of an ith bank set 402(i), the on-chip controller 408 may output an associated sense amp enable signal SA_ENji onto an associated sense amp enable path 502_i(j) via its control interface 414. In response, the sense amp enable input Bji_S I/P of the jth bank 404_i(j) may receive the associated sense amp enable signal SA_ENji, which in turn may trigger one or more sense circuits 302 to perform associated sense operation(s) to load certain data into the jth memory bank 404_i(j).

Each sense amp enable path 502_i(j) associated with a jth bank 404_i(j) of an ith data set 402(i) may extend from the control interface 414 to an associated sense amp enable input Bji_S I/P. In addition, each sense amp enable path 502_i(j) may have an associated length as determined from the control interface 414 to the associated sense amp enable input Bji_S I/P to which it is coupled. For some example configurations, for at least one of the bank sets 402, for a given set of sense amp enable paths 502_i that are associated with banks 404_i of the same ith bank set 402(i), at least two of the sense amp enable paths 502_i have different lengths from each other. In particular example configurations, for at least one of the bank sets 402, all of the sense amp enable paths 502_i associated with banks 404_i of the same ith bank set 402(i) have different lengths from one another, and the relative lengths are inversely related (or inversely proportional) to the relative distances of the banks 404_i to the on-chip controller 408 and/or its control interface 414. For at least some of these particular example configurations, the lengths of the associated sense amp enable paths 502_i may also be inversely related to the distances of the banks 404_i to the BM SerDes 410.

In further detail, and as previously described with respect to the first bank set 402(1), the banks 404_i of a given ith bank set 402(i) may have relative distances to and/or physical positions with respect to the BM SerDes 410. Similarly, the banks 404_i of a given ith bank set 402(i) may have relative distances to the on-chip controller 408 and/or its control interface 414. For at least one of the bank sets 402, the relative distances of the banks in a given bank set to the on-chip controller 408 and/or its control interface 414 and the relative of distances of the banks in the given bank set to the BM SerDes 410 are directly related. That is, in a given ith bank set 402(i), the farthest bank in that bank set 402(i) to the BM SerDes 410 is also the farthest bank to the on-chip controller 408 and/or its control interface 414. Similarly, the closest bank in the bank set 402(i) to the BM SerDes 410 is also the closest bank to the on-chip controller 408 and/or its control interface 414.

In the example configuration shown in FIG. 5, for at least one of the bank sets 402, the relationship between the distances or positions of the banks 404_i of an ith bank set 402(i) to the on-chip controller 408 and/or the BM SerDes 410 and their associated sense amp enable paths 502_i may be inversely related. That is, among the banks 404_i of a given ith bank set 402(i), the farther a jth bank 404_i(j) is positioned away from or the longer a relative distance of the jth bank 404_i(j) is from the control interface 414, the shorter its associated sense amp enable path 502_i(j) compared to the other sense amp enable paths 502_i associated with the ith bank set 402(i). Conversely, the closer a jth bank 404_i(j) is positioned to or the shorter a relative distance of a jth bank 404_i(j) is to the control interface 414, the longer its associated sense amp enable path 502_i(j) compared to the other sense amp enable paths 502_i associated with the ith bank set 402(i). Similarly, among the banks 404_i of a given ith bank set 402(i), the farther a jth bank 404_i(j) is positioned away from or the longer a relative distance of the jth bank 404_i(j) is from the BM SerDes 410, the shorter its associated sense amp enable path 502_i(j) compared to the other sense amp enable paths 502_i associated with the ith bank set 402(i). Conversely, the closer a jth bank 404_i(j) is positioned to or the shorter a relative distance of the jth bank 404_i(j) is to the BM SerDes 410, the longer its associated sense amp enable path 502_i(j) compared to the other sense amp enable paths 502_i associated with the ith bank set 402(i).

This inverse relationship between sense amp enable path lengths and positions of the banks relative to the control interface 414 and/or the BM SerDes 410 is illustrated in FIG. 5 with respect to the first bank set 402(1). The first bank 404_1(1) of the first bank set 402(1) is positioned farthest from the control interface 414 and the BM SerDes 410. Accordingly, the first bank 404_1(1) is coupled to the shortest sense amp enable path 502_1(1) among the sense amp enable paths 502_1 coupled to the banks 404_1 of the first bank set 402(1). On the other hand, the Nth bank 404_1(N) of the first bank set 402(1) is positioned closest to the control interface 414 and the BM SerDes 410. Accordingly, the Nth bank 404_1(N) is coupled to the longest sense amp enable path 502_1(N) among the sense amp enable paths 502_1 coupled to the banks 404_1 of the first bank set 402(1).

Such an inverse relationship as shown in FIG. 5 with respect to the first bank set 402(1) is in contrast to other example configurations that have a direct relationship between sense amp paths and positions of the banks relative to the control interface 414 and/or the BM SerDes 410. Under a direct relationship, the farther a jth bank 404_i(j) of an ith bank set 402(i) is positioned from the control interface 414 and/or the BM SerDes 410, the longer its associated sense amp enable signal. Likewise, the closer the jth bank 404_i(j) is positioned to the control interface 414 and/or the BM SerDes 410, the shorter it associated sense amp enable path. This latter approach that utilizes direct relationships between positions of banks and the sense amp enable lengths may be the more intuitive of the two approaches since the direct relationship is the result of configuring sense amp enable paths to be as direct and short as possible. However, the former approach that utilizes inverse relationships, as shown in FIG. 5, may offer certain benefits with respect to minimizing sense amp enable latency and maximizing sampling windows, as described in further detail below.

In addition or alternatively, sense amp enable paths 502_i associated with the same ith bank set 402(i) may have relative lengths that are inversely related to relative lengths of data paths associated with the same ith bank set 402(i). Herein, a jth sense amp enable path 502_i(j) is associated with an ith bank set 402(i) where the jth sense amp enable path 502_i(j) is coupled to a sense amp enable input Bji_S I/P of a jth bank 404_i(j) that is part of the ith bank set 402(i). Similarly, a given data path is associated with an ith bank set 402(i) where the given data path is coupled to a data output Bji_D O/P of a jth bank 404_i(j) that is part of the ith bank set 402(i). Also, a sense amp enable path is associated with a data path where they are both associated with the same jth bank 404_i(j) of the same ith bank set 402(i). That is, a sense amp enable path 502_i(j) is associated with a data path where the sense amp enable input Bji_S I/P that is coupled to the sense amp enable path 502_i(j) and the data output Bji_S I/P that is coupled to the data path are part of the same jth bank 404_i(j) of the same ith bank set 402(i). Accordingly, for a given jth sense amp enable path 502_i(j) and an associated data path, both associated with the same ith bank set 402(i), the inverse relationship is as follows: the longer the length of the jth sense amp enable path 502_i(j) relative to the lengths of the other sense amp enable paths 502_i associated with the ith bank set 402(i), the shorter the length of the associated data path relative to the lengths of the other data paths associated with the ith bank set; and the shorter the length of the jth sense amp enable path 502_i(j) relative to the lengths of the other sense amp enable paths 502_i associated with the ith bank set 402(i), the longer the length of the associated data path relative to the lengths of the other data paths associated with the ith bank set.

The lengths of the sense amp enable paths 502 and data paths may directly correspond to an amount of time or propagation delay for respectively communicating sense amp enable signals SA_EN and data signals (or data pulses). That is, the longer a given jth sense amp enable path 502_i(j), the longer the amount of time or the larger the amount of propagation delay for an associated sense amp enable signal SA_EN_ji to be communicated along the jth sense amp enable path 502_i(j) from the control interface 414 to the associated sense amp enable input Bji_S I/P. Likewise, the shorter a given jth sense amp enable path 502_i(j), the shorter the amount of time or the smaller the amount of propagation delay for an associated sense amp enable signal SA_EN_ji to be communicated along the jth sense amp enable path 502_i(j) from the control interface 414 to the associated sense amp enable input Bji_S I/P.

In a similar manner, the longer a given data path, the longer the amount of time or the larger the amount of propagation delay for a data signal or data pulse to be communicated along the given data path from an associated data output Bji_D O/P to the BM SerDes 410. Likewise, the shorter a given data path, the shorter the amount of time or the smaller the amount of propagation delay for the data signal or data pulse to be communicated along the given data path from an associated data output Bji_D O/P to the BM SerDes 410.

Given these associated relationships between sense amp enable paths 502 and data paths, with respect to the first bank set 402(1) in FIGS. 4 and 5, the first bank 404_1(1) may be associated with the shortest sense amp enable path 502_1(1) among the sense amp enable paths 502_1 associated with the first bank set 402(1), and may also be associated with the longest data path to the BM SerDes 410 among the data paths associated with the first bank set 402(1). In this context, the on-chip controller 408 may be configured to transmit an associated sense amp enable signal SA_EN_11 to the first bank 404_1(1) in a shorter amount of time compared to other amounts of time to transmit other sense amp enable signals SA_EN from the control interface 414 to the other banks of the first bank set 402(1). At the same time, the first bank 404_1(1) may take a longer amount of time to transmit a data pulse along its associated data path to the BM SerDes 410 compared to other amounts of time for the other banks 404_1 of the first bank set 402(1) to transmit respective data pulses along their respective data paths to the BM SerDes 410.

Similarly, the Nth bank 404_1(N) may be associated with the longest sense amp enable path 502_1(N) among the sense amp enable paths 502_1 associated with the first bank set 402(1), and may also be associated with the shortest data path to the BM SerDes 410 among the data paths associated with the first bank set 402(1). In this context, the on-chip controller 408 may be configured to transmit an associated sense amp enable signal SA_EN_N1 to the Nth bank 404_1 (N) in a longer amount of time compared to other amounts of time to transmit other sense amp enable signals SA_EN from the control interface 414 to the other banks of the first bank set 402(1). At the same time, the Nth bank 404_1(N) may take a shorter amount of time to transmit a data pulse along its associated data path to the BM SerDes 410 compared to other amounts of time for the other banks 404_1 of the first bank set 402(1) to transmit respective data pulses along their respective data paths to the BM SerDes 410.

The sense amp enable paths 502_2 and data paths associated with the second bank set 402(2) may have similar relationships. For example, the first bank 404_2(1) may be associated with the shortest sense amp enable path 502_2(1) among the sense amp enable paths 502_2 associated with the second bank set 402(2), and may also be associated with the longest data path to the BM SerDes 410 among the data paths associated with the second bank set 402(2). In this context, the on-chip controller 408 may be configured to transmit an associated sense amp enable signal SA_EN_12 to the first bank 404_2(1) in a shorter amount of time compared to other amounts of time to transmit other sense amp enable signals SA_EN from the control interface 414 to the other banks of the second bank set 402(2). At the same time, the first bank 404_2(1) may take a longer amount of time to transmit a data pulse along its associated data path to the BM SerDes 410 compared to other amounts of time for the other banks 404_2 of the second bank set 402(2) to transmit respective data pulses along their respective data paths to the BM SerDes 410.

Similarly, the Nth bank 404_2(N) may be associated with the longest sense amp enable path 502_2(N) among the sense amp enable paths 502_2 associated with the second bank set 402(2), and may also be associated with the shortest data path to the BM SerDes 410 among the data paths associated with the second bank set 402(2). In this context, the on-chip controller 408 may be configured to transmit an associated sense amp enable signal SA_EN_N2 to the Nth bank 404_2(N) in a longer amount of time compared to other amounts of time to transmit other sense amp enable signals SA_EN from the control interface 414 to the other banks of the second bank set 402(2). At the same time, the Nth bank 404_2(N) may take a shorter amount of time to transmit a data pulse along its associated data path to the BM SerDes 410 compared to other amounts of time for the other banks 404_12 of the second bank set 402(2) to transmit respective data pulses along their respective data paths to the BM SerDes 410.

The sense amp enable paths 502 may be configured in any of various ways so that their associated lengths are inversely related to the distances of the banks to the on-chip controller 408 and/or the BM SerDes 410, and/or are inversely related to lengths of associated data paths, as previously described. For some example configurations, with reference to FIGS. 4 and 5, the sense amp enable paths 502 may be configured such that for a given ith bank set 402(i), at least one of the sense amp enable paths 502_i associated with at least one bank 404_i other than the bank associated with the shortest sense amp enable path and the longest data path, includes two portions that extend substantially parallel with a boundary separating the bank sets 402 and at least one of the on-chip controller 408, the BM SerDes 410, or the NM SerDes 412.

In further detail, from the perspective that FIGS. 4 and 5 show a top view of a physical layout of the components, FIG. 5 shows a boundary, represented by a dashed line 504. FIG. 5 shows the on-chip controller 408, the BM SerDes 410, and the NM SerDes 412 located or positioned on one side of the boundary 504 and the banks sets 402 located or positioned on the other or opposite side of the boundary 504. Also, in some example configurations as shown in FIG. 5, banks 404_i that are part of the same ith bank set 402(i) may be physically aligned or positioned relative to each other such that the banks 404_i extend substantially parallel with the boundary 504. As used herein, a component, such as a path or a bank set, extends substantially parallel with the boundary 504 where the component extends in a direction that is substantially parallel with a direction in which the boundary 504 extends. At a minimum, by being substantially parallel, the component extends in a direction that is more or just as parallel to the direction in which the boundary extends as it is perpendicular to the direction in which the boundary 504 extends.

Additionally, as shown in FIG. 5, for a given set of sense amp enable paths 502_i associated with an ith bank set 402(i), the sense amp enable paths 502_i may each include a first portion, indicated by an associated ith dotted box 506_i, that extends substantially parallel with the boundary 504. Additionally, at least one of the sense amp enable paths 502_i, other than the shortest one, may include a second portion, indicated by an associated dotted box 508_i, that extends substantially parallel with the boundary 504. In some example configurations, the first and second portions of a given sense amp enable path may be separate portions of the sense amp enable path in that they are separated by a third portion that extends substantially perpendicular to the boundary 504. Also, for a given sense amp enable path that includes a first portion and a second portion, the first portion may be positioned closer to the control interface 414, whereas the second portion may be positioned closer to an associated sense amp enable input Bji_S I/P. Accordingly, when the on-chip controller sends a sense amp enable signal SA_EN over a sense amp enable path that includes a first portion and a second portion, the sense amp enable signal SA_EN may propagate over the first portion before it propagates over the second portion in order to reach the associated sense amp enable input Bji_S I/P.

As mentioned, various other ways of configuring the sense amp enable paths to establish various propagation delays and an inverse relationship between their relative lengths and the relative lengths of the data paths may be possible.

In addition, configuring the sense amp enable paths 502 and the data paths that are associated with the same ith bank set 402(i) to have an inverse relationship between their relative lengths may provide certain advantages with respect to reducing read latency. As mentioned, the on-chip controller 408 and the voltage supply circuitry may take a certain amount of bias time Tbias to perform a biasing process. It may be undesirable for a sense circuit 302 configured to perform a sense operation on memory cells subjected to the biasing process to actually perform the sense operation before the bias time period Tbias has ended. That is, if sense circuit 302 performs a sense operation before the bias time period Tbias has elapsed, the sense circuit 302 may sense incorrect data from the memory cells since the sense circuit 302 will not have allowed for enough time for the memory cells to be adequately biased to their appropriate levels before sensing the memory cells. As such, when the on-chip controller 408 wants certain data loaded into a jth bank 404_i(j) of an ith bank set 402(i), the on-chip controller 408 may not want to output the associated sense amp enable signal SA_EN_ji at a time that would cause the jth bank 404_i(j) to receive the sense amp enable signal SA_ENji too soon—i.e., at a time before the bias time period Tbias has elapsed.

The on-chip controller 408 may include or otherwise utilize a timer circuit 510 to determine when a bias time period Tbias has ended. Through use of the timer circuit 510, the on-chip controller 408 can ensure that it does not send the sense amp enable signals SA_EN too early.

For a given jth bank 404_j(i) of an ith bank set 402(i), under the presumption that a sense circuit 302 can successfully perform a sense operation to load data into the jth bank 404_j(i) as soon as the bias time period Tbias has ended, the sense amp enable input Bji_S I/P of the jth bank 404 can receive the associated sense amp enable signal SA_EN_ji as soon as the bias time period Tbias has ended. In the event that the sense amp enable input Bji_S I/P receives the associated sense amp enable signal SA_EN_ji after the bias time period Tbias has ended, a period or amount of time T1 may be wasted where the sense circuit 302 is idle instead of performing the sense operation. This period or amount of wasted time may be referred to as sense amp enable latency T1. Because some amount of propagation delay occurs from the time the associated sense amp enable signal SA_EN_ji is output from the control interface 414 to the time it reaches the sense amp enable input Bji_S I/P, the components on the memory die 104 may perform a read operation with an amount of sense amp enable latency T1 when the on-chip controller 408 is configured to output the sense amp enable signal SA_EN_ji as soon as its timer circuit 510 detects that the bias time period Tbias has ended.

Figures 6A, 6B:
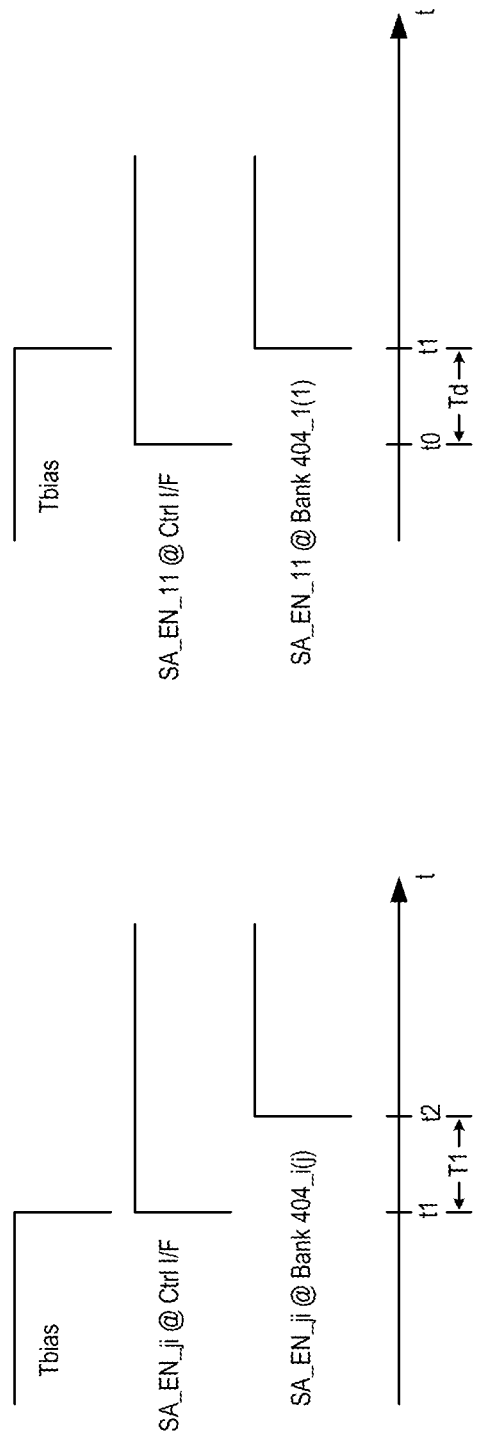
FIG. 6A is a timing diagram illustrating latency between the end of a bias time period and receipt of a sense amp enable signal.
FIG. 6B is a timing diagram illustrating elimination of the latency shown in FIG. 6A.

FIG. 6A is a timing diagram illustrating a read operation performed with sense amp enable latency T1. The top waveform in FIG. 6A depicts a bias time period ending at an end time t1. As soon as or simultaneously with the bias time period Tbias ending at the end time t1, the control interface 414 outputs a sense amp enable signal SA_EN_ji. This event is depicted by the middle waveform of FIG. 6A, labeled "SA_EN_ji @ Ctrl I/F." Due to an associated propagation delay, the associated sense amp enable input Bji_S I/P may not receive the sense amp enable signal SA_EN_ji until a receipt time t2. This event is depicted by the bottom waveform of FIG. 6A, labeled "SA_EN_ji @ Bank 404_i(j)." Consequently, a sense amp enable latency T1 corresponding to a propagation delay of the associated sense amp enable path 502_i(j), which extends from the end time t1 to the receipt time t2, may be experienced.

In order to eliminate or minimize sense amp enable latency T1, the on-chip controller 408 may be configured to compensate for the sense amp enable latency T1 by output the sense amp enable signals SA_EN before respective bias time periods Tbias end at end times t1. In one example optimized configuration, the on-chip controller 408 may be configured to output the sense amp enable signals SA_EN at an advanced time t0 in advance of the end time t1 in a way that optimizes for the bank of an ith bank set 402(i) that is farthest from the control interface 414. In particular, with reference to the first bank set 402(1) to illustrate, the on-chip controller 408 may be configured to output the sense amp enable signals SA_EN_11 at an advance time t0 such that the sense amp enable signal SA_EN_11 that is sent to the farthest bank 404_1(1) of the first bank set 402(1) reaches the associated sense amp enable input B11_S at the end time t1.

FIG. 6B illustrates this optimized configuration with respect to the farthest bank 404_1(1) of the first bank set 402(1). The top waveform of FIG. 6B illustrates a bias time period Tbias ending at a time t1. The middle waveform of FIG. 6B, labeled "SA_EN_11 @ Ctrl I/F" illustrates the on-chip controller 408 outputting the sense amp enable signal SA_EN_11 at its control interface 414 at an advance time t0 before the bias time period Tbias has elapsed at the end time t1. The amount of time in advance of time t1, labeled Td in FIG. 6B, is referred to as an amount of compensation time Td. The sense amp enable path 502_1(1) associated with the farthest bank 402_1(1) may have a propagation delay such that the sense amp enable signal SA_EN_11 reaches the sense amp enable input B11_S I/P of the first bank 404_1(1) when the bias time period Tbias ends at the time t1, as depicted by the bottom waveform of FIG. 6B, labeled "SA_EN_11 @ Bank 404_1(1)." In this way, the sense amp enable latency T1, as shown in FIG. 6A, is eliminated or at least minimized when the on-chip controller 408 sends the sense amp enable signal SA_EN_11 to the farthest bank 404_1(1) of the first bank set.

Referring back to FIG. 5, with reference still to the first bank set 402(1), the sense amp enable propagation delays increase as the banks 404_1 of the first set 402(1) are positioned closer to the control interface 414 due to the increasing lengths of the associated sense amp enable paths 502_1, as previously described. As such, although sense amp enable latency T1 may be optimized or minimized with respect to the farthest bank 404_1(1), the sense amp enable latencies T1 increase for the other banks 404_1 of the first bank set 402(1), where those sense amp enable latencies T1 increase as the other banks 404_1 are positioned closer to the control interface 414. However, the increasing sense enable latency T1 may be offset by the decreasing data path latency corresponding to the decreasing propagation delay provided by the decreasing signal path lengths to the BM SerDes 410, as previously described.

For some example configurations, the on-chip controller 408 may be configured to determine the bias time periods Tbias, including the start and end times of the bias time periods Tbias, as well as determine when to output the sense amp enable signals SA_EN according to a controller clock, e.g., an internal clock (not shown in FIG. 5). In some example configurations, the controller clock may be a clock signal received from the off-chip controller 102 or generated in response to a clock signal received from the off-chip controller 102. The bias time Tbias may correspond to a first predetermined number of clock cycles or clock periods of the controller clock. The timer circuit 510 may determine when a bias time period Tbias starts, and then may begin counting a number of clock cycles of the internal clock. The timer circuit 510 may determine that the first predetermined number of clock cycles has been reached, and in response to the determination, determine that the bias time period Tbias has ended (i.e., the end time t1 has occurred). For such example configurations, the on-chip controller 408 may determine when to output the sense amp enable signals SA_EN by counting to a second number predetermined number of clock cycles that is an n-number of clock cycles less than the first predetermined number of clock cycles. For some example configurations, n is one, meaning that the on-chip controller 408 is configured to output the sense amp enable signals SA_EN one clock cycle of the controller clock ahead of the bias time period Tbias ending. Other configurations where n is greater than one—i.e., where the on-chip controller 408 outputs the sense amp enable signals SA_EN more than one clock cycle ahead of the end of the bias time period Tbias—may be possible.

In sum, at least one of the bank sets 402, such as the first bank set 402(1), may include banks that have increasing relative distances to the on-chip controller 408 and/or to the BM SerDes 410. The banks of the bank set may have associated sense amp enable paths such that as the banks are positioned farther away from the control interface 414 of the on-chip controller 408, their associated sense amp enable paths are shorter and their associated data paths to the BM SerDes 410 are longer. The on-chip controller 408 may be configured to send the sense amp enable signals a certain compensation time period Td ahead of the ends of bias time periods Tbias, and the certain compensation time period Td may be optimized with respect to the farthest bank of bank group from the control interface 414. That is, the certain compensation time period Td may correspond to the propagation delay of the sense amp enable signal path associated with the farthest bank. The other banks of the bank set that are closer to the control interface 414 have associated sense amp enable paths with unoptimized lengths in that they provide longer sense amp propagation delays relative to the compensation time period Td, resulting in increasingly longer sense amp enable latencies T1. However, the increasingly longer sense amp enable latencies T1 are offset by the increasingly shorter propagation delay provided by the increasingly shorter data paths from the other banks to the BM SerDes 410. As a result, the overall sense amp enable latency T1 may be optimized for a given bank set since the sense amp enable latency T1 associated with the farthest bank may be avoided, and the increasing sense amp enable latencies T1 associated with the other banks may be offset by their decreased data path lengths to the BM SerDes 410.

In addition, for some example configurations, at least one of the bank sets 402 may not include banks that have increasing distances from to the control interface 414 and/or the BM SerDes 410. This is illustrated in FIGS. 4 and 5 with respect to the second bank set 402(2), where due to the relative positioning of the banks 404_2 of the second bank set 402(2) and the BM SerDes, the banks 404_2 may not have a particular order of increasing distances from the BM SerDes 410 from the first bank 404_2(1) to the Nth bank 404_2(N). Irrespective of this relative positioning, the banks 404_2 of the second bank set 402(2) may have associated sense amp enable paths with relative lengths that are inversely related to relative lengths of associate data paths. This way, the on-chip controller 408 may be configured to send sense amp enable signals SA_EN at the same compensation amount of time Td ahead of the end of the bias time period Tbias without having to be specially configured for the different bank sets.

In addition to sending sense amp enable signals SA_EN to the banks 404, the on-chip controller 408 may also be configured to send a clock signal CLK to the banks 404. The clock signal CLK may be the same or different than the controller clock that the on-chip controller 408 uses to determine the end of the bias time periods Tbias and when to send the sense amp enable signals SA_EN. The on-chip controller 408 may send the clock signal CLK to the banks 404 to trigger the banks 404 to transmit data they have onto their respective data paths. In other words, if the on-chip controller 408 sends the sense amp enable signals SA_EN but not the clock signals CLK, the banks 404 would have the data sensed from the memory cell structure 142, but they would not be prompted to send the data onto the data path to the BM SerDes 410.

FIG. 7 is a block diagram of the example components involved in a read operation as shown in FIGS. 4 and 5, but shows an example configuration of clock paths instead of the data paths (FIG. 4) or the sense amp enable paths 502 (FIG. 5). In actual implementation, the data paths shown in FIG. 4, the sense enable paths 502 shown in FIG. 5, and the clock paths shown in FIG. 7 are all present on the memory die 104. For clarity, FIG. 7 shows the clock paths in isolation from the data paths and the sense amp enable paths 502.

In the example configuration shown in FIG. 7, the on-chip controller 408 may be configured to output different clock signals to banks 404 of different bank sets 402, and may be configured to output the same clock signal to banks 404 of the same bank set 402. For example, as shown in FIG. 7, the on-chip controller 408 may be configured to output a first clock signal CLK1 to banks 404_1 of the first bank set 402(1), and may be configured to output a second clock signal CLK2 to banks 404_2 of the second bank set 402(2). The on-chip controller 408 may be configured to output the clock signals CLK1, CLK2 from its control interface 414.

The on-chip controller 408 may be coupled to the banks 404 and the BM SerDes 410 by way of a plurality of clock paths configured to communicate the clock signals from the on-chip controller 408 to the banks 404 and the BM SerDes 410. In particular, the clock paths may couple the clock outputs of the control interface 414 to the clock inputs Bji_C I/P of the banks 404 and clock inputs SDS_C(S1) I/P, SDS_C(S2) I/P of the BM SerDes 410. When the on-chip controller 408 wants to send the clock signals CLK1, CLK2 to the banks 404 and/or to the BM SerDes 410, the control interface 414 outputs the clock signals CLK1, CLK2 onto the clock paths. In turn, the clock paths communicate the clock signals CLK1, CLK2 to respective clock inputs Bji_C I/P of the banks 404 and clock inputs SDS_C(S2) I/P, SDS_C(S2) I/P of the BM SerDes 410.

In further detail, two clock paths may be associated with the BM SerDes 410. One of the clock paths may communicate the first clock signal CLK1 from the on-chip controller 408 to a first clock input SDS_C(S1) I/P of the SerDes 410, and the other clock path may communicate the second clock signal CLK2 from the on-chip controller 408 to a second clock input SDS_C(S2) I/P of the SerDes 410. As described in further detail below, the BM SerDes 410 may use the first clock signal CLK1 to determine when to sample (or otherwise capture, hold, obtain, identify, or determine) the levels of the data pulses of the data signals it receives from the banks 404_1 of the first set 402(1) at its first data input SDS_D(S1) I/P. Similarly, the BM SerDes 410 may use the second clock signal CLK2 to determine when to sample the levels of the data pulses of the data signals it receives from the banks 404_2 of the second set 402(2) at its second data input SDS_D(S2) I/P.

The other clock paths may each be associated with one of the banks 404 and coupled to a clock input Bji_C I/P of a jth bank 404_i(j) of an ith bank set 402(i) with which the clock path is associated. In addition, each clock path may include two portions, including a specific portion 702 that is specific to an associated bank 404, and a common or shared portion that is common or shared with other clock paths associated with banks 404 of the same bank set 402. The common or shared portion may be referred to as a common clock path CCP. Each ith bank set 402(i) may be associated with a respective ith common clock path CCPi. So, for the example configuration shown in FIG. 7, the first set of banks 402(1) may be associated with a first common clock path CCP1, and the second set of banks 402(2) may be associated with a second common clock path CCP2.

When the on-chip controller 408 wants to send an ith clock signal CLKi to one or more banks 404_i of an ith bank set 402(i), it may send the ith clock signal CLKi from its control interface 414 onto the ith common clock path CCPi, and the ith common clock path CCPi may communicate the ith clock signal CLKi toward the banks $404\_i$ of the ith bank set $402(i)$. Thereafter, the ith clock signal CLKi may branch off onto the specific clock path portions $702\_i$ associated with each of the banks $404\_i$ of the ith bank set $402(i)$, and each jth specific clock path portions $702\_i(j)$ may communicate the ith clock signal CLKi to the clock input Bji_C I/P of the jth bank $404\_i(j)$ with which it is associated.

When a jth bank $404\_i(j)$ of an ith data set $402(i)$ receives a clock pulse of an ith clock signal CLKi at its clock input Bji_C I/P, it may respond, such as in response to a rising edge (rising transition) or a falling edge (falling transition), by outputting in parallel an M-number of data pulses corresponding to bits of data that the jth bank $404\_i(j)$ has to send to the BM SerDes 410. The jth bank $404\_i(j)$ may output the M-number of data pulses onto its associated specific data path portion $416\_i(j)$ via its associated data output Bji_D O/P.

A sense circuit 302 may take a certain amount of sense time Tsense (alternatively referred to as a sense period Tsense) to perform a sense operation and have data sensed into a bank 404. When the on-chip controller 408 wants a jth bank $404\_i(j)$ of an ith data set $402(i)$ to output data pulses onto its data path, the on-chip controller 408 may want a certain amount of time corresponding to the duration of the sense period Tsense before outputting the ith clock signal CLKi so that the jth bank $404\_i(j)$ does not receive clock pulses of the ith clock signal CLKi too early—i.e., before the sense period Tsense is ended and the jth bank $404\_i(j)$ is ready to output the data pulses.

For clock path configuration other than that shown in FIG. 7, the BM SerDes 410 instead of the on-chip controller 408, may send the clock signals CLK to the bank sets 402. For these other configurations, the on-chip controller 408 may still be the source of the clock generation component of the memory die 104. The on-chip controller 408 generates the clock signal, and then sends the clock signal to the BM SerDes 410 via a clock path extending between a clock output of the on-chip controller 408 and a clock input of the BM SerDes 410. The BM SerDes 410 may include certain clock processing circuitry (e.g., logic circuitry, pipeline control circuitry, clock tree circuitry, etc.) that processes the clock signal it receives from the on-chip controller 408 in order to generate the clock signals CLK1, CLK2, which it sends to the banks 404. The output of a clock signal from the on-chip controller 408 to the BM SerDes 410 and the subsequent processing and output of an ith clock signal CLKi to an ith bank set $402(i)$ takes a certain amount of clock output time and thus incurs a certain amount of clock output latency T1a. In contrast, in the example configuration shown in FIG. 7, the on-chip controller 408, rather than the BM SerDes 408, may output the clock signals CLK1, CLK2 to the bank sets 402. This way, the banks 404 can receive the clock pulses at optimum times following ends of sense periods Tsense, and the components of the memory die 104 can perform read operations without incurring the clock output latency T1a.

In addition, each specific clock path portion $702\_i(j)$ may be connected to an associated common clock path CCPi at an associated connection point Yji. So, as examples, the specific clock path portion $702\_1(1)$ specific to the first bank $404\_1(1)$ of the first bank set $402(1)$ may be connected to the first common clock path CCP1 at a connection point Y11, and the specific clock path portion $702\_1(N)$ specific to the Nth bank $404\_1(N)$ of the first bank set $402(1)$ may be connected to the first common clock path CCP1 at a connection point YN1.

Also, each clock path associated with a jth bank $404\_i(j)$ of an ith bank set $402(i)$ may have an associated total length, which may include a sum of a first length and a second length. The first length is a length of the associated specific clock path portion $702\_i(j)$ extending from the associated clock input Bji_C I/P of the jth bank $404\_i(j)$ to its associated connection point Yji. The second length if a length of the associated common clock path CCPi extending from the control interface 414 of the on-chip controller 408 to the associated connection point Yji.

The clock paths associated with banks $404\_i$ of the same ith bank set $402(i)$ may have total lengths relative to each other. In particular example configurations, the relative lengths may directly correspond to the relative lengths of the sense amp enable paths $502\_i$ associated with the ith bank set $402(i)$. Herein, a clock path and a sense amp enable path $502\_i(j)$ are associated with each other where the specific clock path portion $702\_i(j)$ of the clock path and the sense amp enable path $502\_(j)$ are coupled to the same bank $404\_i(j)$. In other words, the clock input Bji_C I/P coupled to the specific clock path portion $702\_i(j)$ and the sense amp enable input Bji_S I/P are part of the same jth bank $404\_i(j)$.

By having lengths that directly correspond to each other, a clock path and an associated sense amp enable path may have matching propagation delays. That is, the amount of time for a jth sense amp enable path $502\_i(j)$ to communicate a jth sense amp enable signal SA_ENji from the control interface 414 to a sense amp enable input Bji_S I/P of a jth bank $404\_i(j)$ matches or is about the same as the amount of time for an associated clock path to communicate a clock pulse of an ith clock signal CLKi from the control interface 414 to a clock input Bji_C I/P of the jth bank. In addition or alternatively, for a given ith bank set $402(i)$, in a similar way that the lengths and the corresponding propagation delays of the sense amp enable paths $502\_i$ respectively increase from the first bank $404\_i(1)$ to the Nth bank $404\_i(N)$ (as previously described with respect to FIG. 5), the lengths and the corresponding propagation delays of the clock paths may also correspondingly increase from the first bank $404\_i(1)$ to the Nth bank $404\_i(N)$. The direct relationship between the relative lengths of the clock paths and the sense amp enable paths $502\_i$ for a given ith bank set $402(i)$ may optimally allow the banks $404\_i$ of the ith bank set $402(i)$ to receive clock pulses of the ith clock signal CLKi at substantially the same relative time relative to when the banks $404\_i$ perform and complete associated sense operations—i.e., when their respective sense times Tsense end.

In some example configurations, the clock paths may extend substantially parallel with or extend adjacent to and/or alongside associated sense amp enable paths such that their lengths directly correspond to each other. In this context, for some example configurations such as shown in FIG. 7, the common clock paths CCP may include two separate portions that each extend substantially parallel with the boundary 504. For example, the first common clock path CCP1 may include a first portion 704_1 and a second portion 706_1, and the second common clock path CCP may include a first portion 704_2 and a second portion 706_2. The two portions 704, 706 of each common clock path CCP may be separate portions that are separated by a third portion of the common clock path CCP that extends substantially perpendicular to the boundary 504. At least one of the specific clock path portions $702\_i$ may connect to an associated common clock path CCPi at the second portion $706\_i$. For each of the ith bank sets $402(i)$, when the on-chip controller 408 outputs an ith clock signal CLKi, the common clock path CCPi may communicate the ith clock signal CLKi over the first portion 704_i first and then the second portion 706_i second before the ith clock signal CLKi is distributed to the specific clock path portions 702_i. Other configurations to establish desired lengths of the clock paths may be possible.

Additionally, the clock paths associated with the same ith bank set 402(i) may have relative lengths that are inversely related to relative lengths of the data paths associated with the same ith bank set 402(i), in the same or similar way that the sense amp enable paths 502_i associated with the same ith bank set 402(i) have relative lengths that are inversely related to the relative lengths of the data paths associated with the same ith bank set 402(i), as previously described with respect to FIG. 5. Accordingly, for a given ith bank set 402(i), as the lengths and corresponding propagation delays of the data paths respectively decrease from the first bank 404_i(1) to the Nth bank 404_i(N) (as previously described with reference to FIGS. 4 and 5), the lengths and the corresponding propagation delays of the clock paths may correspondingly increase from the first bank 404_i(1) to the Nth bank 404_i(N).

In an example read operation in the memory system 100, and in accordance with the inverse relationships between the relative lengths of the clock paths and the data paths, the on-chip controller 408 may receive a read command from the off-chip controller 102. In response, the controller 408 may determine that two different banks, including a first, pth bank 404_i(p) and a second, qth bank 404_i(q) of the same ith bank set 402(i) are to output consecutive data pulses onto the ith common data bus CBUS_i to the BM SerDes 410. Accordingly, the on-chip controller 408 may send sense amp enable signals SA_EN_pi, SA_EN_qi to the banks 404_i(p), 404_i(q) on associated pth and qth sense amp enable paths 502_i(p), 502_i(q), respectively. Assume that the qth sense amp enable path 502_i(q) has a length that is longer than a length of the pth sense enable path 502_i(p). The qth bank 404_i(q) may also have a physical position closer to the control interface 414 and/or to the BM SerDes 410 than a physical position of the pth bank 404_i(p). The pth bank 404_i(p) and the qth bank 404_i(q) may each retrieve data (or data sets) in response to receipt of the sense amp enable signals SA_EN_pi, SA_EN_qi, such as by causing associated sense circuits 302 to perform sense operations.

Additionally, a qth clock path coupled to the qth bank 404_i(q) may have a length that is longer than a length of a pth clock path coupled to the pth bank 404_i(p), in accordance with the direct relationship between the relative lengths of the clock paths and sense amp enable paths. The on-chip controller 408 may output the ith clock signal CLKi on the pth and qth clock paths, which may include outputting the ith clock signal CLKi on an ith common clock path CCPi, to have the data pulses associated with the retrieved data output onto the ith common data bus CBUS_i. The pth and qth banks 404_i(p), 404_i(q) may respond to the ith clock signal CLK by outputting their respective data pulses onto respective pth and qth data paths, which include their specific data path portions 416_i(p), 416_i(q) and the common data bus portion CBUS_i. In accordance with the inverse relationship between the relative lengths of the clock paths and the data paths, the qth data path associated with the qth bank 404_i(q) has a length that is shorter than a length of the pth data path associated with the pth bank 404_i(p). The BM SerDes 410 may receive the consecutive data pulses from the pth bank 404_i(p) and the qth bank 404_i(q) via the common data bus CBUS_i for subsequent processing.

The direct relationship between the relative lengths of the sense amp enable paths 502_i and the clock paths, and the indirect relationship between the relative lengths clock paths and the data paths may optimize or maximize the duration of the sampling window of the data pules. In further detail, the BM SerDes 410 may be configured to receive consecutive data pulses at a given ith data input SDS_D(Si) I/P of the BM SerDes 410 coupled to an ith common data bus CBUS_i (FIG. 4). Otherwise stated, the ith common data bus CBUS_i presents consecutive data pulses to the ith data input SDS_D (Si) I/P of the BM SerDes 410. The BM SerDes 410 may be configured to sample (or otherwise capture, hold, obtain, store, identify, or determine) the levels of the consecutive data pulses in response to consecutive sampling edges of clock pulses of the ith clock signal CLKi that the BM SerDes 410 receives at its ith clock input SDS_C(Si) I/P. Each data pulse that the BM SerDes 410 receives at its ith data input SDS_D(Si) I/P may have an associated sampling window, which is the amount of time available that the BM SerDes 410 has to sample the level of the data pulse. The sampling window for a given data pulse may begin at the time that the ith data input SDS_D(Si) I/P first receives the given data pulse and ends at the time that the ith data input SDS_D(Si) I/O starts receiving the next data pulse. Otherwise stated, the sampling window begins at the time that the ith common data bus CBUS_i starts presenting the data pulse to the ith data input SDS_D(Si) I/P and ends at the time the ith common data bus CBUS_i starts presenting the next data pulse to the ith data input SDS_D(Si) I/P.

During a read operation, two consecutive data pulses that the ith common data bus CBUS_i presents may be output from two different banks 404_i of an ith bank set 402(i). As previously described, the data paths of the different banks 404_i of the same ith bank set 402(i) may have different lengths. In turn, the ith common data bus CBUS_i may take longer to present data pulses output on longer data paths compared to data pulses output on shorter data paths to the ith data input SDS_D(Si) I/P of the BM SerDes 410. If the clocks paths to the banks 404_i of the same ith bank set 402(i) had the same lengths and in turn the same propagation delay relative to each other, the banks 404_i would output data pulses at relatively equal time intervals corresponding to the edges of the clock pulses. However, since the data paths have different lengths, then the ith common data bus CBUS_i would present consecutive data pulses from different banks 404_i with different sampling windows. In a worst case scenario of a read operation, the first bank 404_i(1) with the longest associated data path and the Nth bank 404_i(N) with the shortest data path output consecutive data pulses onto the ith common data bus CBUS_i, which in turn provides a short sampling window for the data pulse output from the first bank 404_i(1). This resulting mismatch in sampling windows, in turn, may limit the clock speed of the clock signals CLK1, CLK2 provided to the banks 404 and to the BM SerDes 410.

In contrast, in the example configuration shown in FIGS. 4, 5, and 7, the inverse relationship between the relative lengths of the clock paths and the relative lengths of the data paths may cause the banks 404_i of an ith bank set 402(i) to output respective data pulses onto the ith common data bus CBUS_i at unequal time intervals that are inversely proportional to the lengths of the data paths. This, in turn, balances out or compensates for the effect that the unequal data path lengths have in providing unequal sampling windows. Otherwise stated, the inverse relationship between the relative lengths of the clock paths and the relative lengths of the data paths of a given ith bank may yield a balanced presentation of consecutive data pulses to the ith data input SDS_D(Si) I/P, meaning that the sampling windows of consecutive data pulses may be substantially the same or matched irrespective of the different lengths of the data paths or the order in which consecutive data pulses from the different banks 404_i are output onto the ith common data bus CBUS_i. This in turn, may allow for faster clock speeds of the clock signals CLK1, CLK2.

Additionally, although the path optimization configurations described herein are with respect to sense amp enable signals, sense amp enable signals are just one type of control signal and the sense amp enable paths are just one type of control path for which the path optimization configurations may be applicable. Similar path optimization may be applicable for other example configurations where the controller 408 sends control signals via its control interface to the banks by way of control paths, and where the banks respond by retrieving data or performing some other action associated with the control signals. Direct and inverse relationships between the relative lengths of the control paths and the relative lengths of the data paths and clock paths, as described with reference to FIGS. 4-7, may be used for such other example configurations.

Additionally, although the path optimization configurations described herein are with respect to receipt of clock and data signals by the BM SerDes 410, similar optimization configurations may be used for providing clock and data signals to circuits other than the BM SerDes 410, such as the NM SerDes 412, other data receiving circuits configured to receive data, other conversion circuits configured to perform other or comparable conversion operations that convert data configured in one communication format to a second communication format, or other data sampling circuits configured to sample (or otherwise obtain, capture, hold, identify, determine, or latch onto) levels of data pulses through use of a clock signal and/or in accordance with sampling window.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   a first bank coupled to a control interface by way of a first control path; and
   a second bank coupled to the control interface by way of a second control path, the second control path having a length that is longer than a length of the first control path,
   wherein the second bank has a physical position closer to the control interface than a physical position of the first bank.

2. The circuit of claim 1, wherein:
   the first bank is configured to:
      retrieve first data in response to receipt of a first control signal by way of the first control path; and
      output the first data to a data receiving circuit; and
   the second bank is configured to:
      retrieve second data in response to receipt of a second control signal by way of the second control path; and
      output the second data to the data receiving circuit.

3. The circuit of claim 2, wherein:
   the first bank is configured to output the first data on a first data path to the data receiving circuit,
   the second bank is configured to output the second data on a second data path to the data receiving circuit, and
   the first data path has a length longer than a length of the second data path.

4. The circuit of claim 3, wherein the first data path and the second data path share a common data bus.

5. The circuit of claim 2, wherein the data receiving circuit comprises a serializer/deserializer circuit.

6. The circuit of claim 2, further comprising:
   a controller configured to output the first control signal in advance of an end of a bias time period associated with the first bank.

7. The circuit of claim 6, wherein the controller is configured to output the first control signal one clock cycle ahead of the end of the bias time period.

8. The circuit of claim 1, wherein:
   the first bank is coupled to the control interface further by way of a first clock path,
   the second bank is coupled to the control interface further by way of a second clock path, the second clock path having a length that is longer than a length of the first clock path.

9. The circuit of claim 8, wherein the first clock path and the second clock path share a common clock path portion.

10. The circuit of claim 1, wherein the first control path comprises a first sense amp enable path and the second control path comprises a second sense amp enable path.

11. A circuit comprising:
    a controller configured to output a clock signal on a first clock path and on a second clock path, the second clock path having a length longer than a length of the first clock path;
    a first bank configured to:
       receive the clock signal via the first clock path; and
       in response to receipt of the clock signal, output first data to a data receiving circuit via a first data path; and
    a second bank configured to:
       receive the clock signal via the second clock path; and
       in response to receipt of the clock signal, output second data to the data receiving circuit via the second data path, the second data path having a length shorter than a length of the first data path.

12. The circuit of claim 11, wherein the controller is further configured to:
    output a first sense amp enable signal on a first sense amp enable path to the first bank; and
    output a second sense amp enable signal on a second sense amp enable path to the second bank,
    wherein the second sense amp enable path has a length longer than a length of the first sense amp enable path.

13. The circuit of claim 12, wherein the controller is further configured to:
    output the first sense amp enable signal in advance of an end of a bias time associated with the first bank.

14. The circuit of claim 11, wherein the first bank and the second bank are part of a bank set comprising a plurality of banks, and wherein the first bank has a farthest distance from the receiving circuit among the plurality of banks.

15. The circuit of claim 11, wherein the first data path and the second data path share a common data bus.

16. The circuit of claim 11, wherein the data receiving circuit comprises a serializer/deserializer circuit.

17. The circuit of claim 16, wherein the serializer/deserializer circuit comprises a burst mode serializer/deserializer circuit.

18. A system comprising:
    a common data bus;
    a data sampling circuit;

an on-chip controller configured to:
   output a clock signal;
   receive a read command from an off-chip controller; and
   in response to the read command, output a first sense enable signal on a first sense enable path and a second sense enable signal on a second sense enable path, wherein the second sense enable path comprises a length longer than a length of the first sense enable path;
a plurality of memory banks coupled to the common data bus, the plurality of memory banks comprising:
a first memory bank configured to:
   receive the clock signal;
   receive the first sense enable signal via the first sense enable path; and
   in response to receipt of the clock signal and the first sense enable signal, output first data to the data sampling circuit via a first data path comprising the common data bus; and a second memory bank configured to:
   receive the clock signal;
   receive the second sense enable signal via the second sense enable path; and
   in response to receipt of the clock signal and the second sense enable signal, output second data to the data sampling circuit via a second data path comprising the common data bus, wherein the second data path comprises a length shorter than a length of the first data path.

19. The system of claim 18, wherein the plurality of memory banks are coupled to the on-chip controller by way of sense amp enable paths and clock paths, and wherein relative lengths of the sense amp enable paths and relative lengths of the clock paths are directly related.

20. The system of claim 18, wherein the plurality of memory banks are coupled to the on-chip controller by way of clock paths, and wherein the plurality of memory banks are coupled to the data receiving circuit by way of data paths, and wherein relative lengths of the clock paths and relative lengths of the data paths are inversely related.

* * * * *